US011213920B2

(12) United States Patent
Stempfer et al.

(10) Patent No.: US 11,213,920 B2
(45) Date of Patent: Jan. 4, 2022

(54) METHOD AND ARRANGEMENT FOR BUILDING METALLIC OBJECTS BY SOLID FREEFORM FABRICATION

(71) Applicant: Norsk Titanium AS, Hønefoss (NO)

(72) Inventors: Ferdinand Stempfer, Aspersdorf (AT); Hilde Løken Larsen, Oslo (NO); Pedro Almeida, Asker (NO); Martin Mathisen, Hønefoss (NO)

(73) Assignee: Norsk Titanium AS, Honefoss (NO)

( * ) Notice: Subject to any disclaimer, the term of this patent is extended or adjusted under 35 U.S.C. 154(b) by 818 days.

(21) Appl. No.: 15/206,154

(22) Filed: Jul. 8, 2016

(65) Prior Publication Data

US 2016/0318130 A1   Nov. 3, 2016

Related U.S. Application Data

(63) Continuation-in-part of application No. 14/008,307, filed as application No. PCT/NO2012/000033 on Mar. 30, 2012, now Pat. No. 9,481,931.

(30) Foreign Application Priority Data

Mar. 31, 2011 (GB) .................................... 1105433

(51) Int. Cl.
*B23K 26/342* (2014.01)
*B23K 28/02* (2014.01)
(Continued)

(52) U.S. Cl.
CPC .............. *B23K 28/02* (2013.01); *B22F 12/00* (2021.01); *B23K 10/006* (2013.01);
(Continued)

(58) Field of Classification Search
CPC .... B23K 28/02; B23K 26/342; B23K 26/348; B23K 26/60; B23K 26/702; B23K 10/006;
(Continued)

(56) References Cited

U.S. PATENT DOCUMENTS 3,136,882 A   6/1964  Radtke
3,187,216 A   6/1965  Sciaky
(Continued)

FOREIGN PATENT DOCUMENTS

CN        1586788 A    3/2005
CN      101024482      8/2007
(Continued)

OTHER PUBLICATIONS

Cao et al. English translation of CN202344111, Jul. 2012. (Year: 2012).*

(Continued)

*Primary Examiner* — Chee-Chong Lee
(74) *Attorney, Agent, or Firm* — Lee & Hayes, P.C.

(57) ABSTRACT

Provided are a systems and methods for manufacturing objects by solid freeform fabrication, especially titanium and titanium alloy objects, wherein the deposition rate is increased by using two separate heat sources, one heat source for heating the deposition area on the base material and one heat source for heating and melting a metallic material, such as a metal wire or a powdered metallic material.

20 Claims, 11 Drawing Sheets

(51) Int. Cl.

| | | |
|---|---|---|
| *B23K 10/02* | (2006.01) | |
| *B23K 15/00* | (2006.01) | |
| *B23K 26/348* | (2014.01) | |
| *B23K 26/60* | (2014.01) | |
| *G05B 19/4099* | (2006.01) | |
| *B23K 26/06* | (2014.01) | |
| *B23K 10/00* | (2006.01) | |
| *B23K 26/70* | (2014.01) | |
| *B23K 15/10* | (2006.01) | |
| *B29C 64/153* | (2017.01) | |
| *B22F 12/00* | (2021.01) | |
| *B33Y 30/00* | (2015.01) | |
| *B33Y 10/00* | (2015.01) | |
| *B33Y 50/02* | (2015.01) | |
| *B23K 103/14* | (2006.01) | |
| *B22F 10/10* | (2021.01) | |

(52) U.S. Cl.
CPC ........ *B23K 10/027* (2013.01); *B23K 15/0026* (2013.01); *B23K 15/0033* (2013.01); *B23K 15/0086* (2013.01); *B23K 15/10* (2013.01); *B23K 26/0608* (2013.01); *B23K 26/342* (2015.10); *B23K 26/348* (2015.10); *B23K 26/60* (2015.10); *B23K 26/702* (2015.10); *B29C 64/153* (2017.08); *G05B 19/4099* (2013.01); *B22F 10/10* (2021.01); *B22F 2998/10* (2013.01); *B22F 2999/00* (2013.01); *B23K 2103/14* (2018.08); *B33Y 10/00* (2014.12); *B33Y 30/00* (2014.12); *B33Y 50/02* (2014.12); *G05B 2219/35134* (2013.01); *G05B 2219/45135* (2013.01); *Y02P 10/25* (2015.11)

(58) Field of Classification Search
CPC .............. B23K 10/027; B23K 15/0026; B23K 15/0033; B23K 15/0086; B29C 64/153; B22F 3/1055
USPC ...................................................... 219/73.21
See application file for complete search history.

(56) References Cited

U.S. PATENT DOCUMENTS

| | | | |
|---|---|---|---|
| 3,535,489 A | 10/1970 | Hinrichs | |
| 3,592,995 A | 7/1971 | Hinrichs | |
| 3,766,355 A | 10/1973 | Kottkamp | |
| 4,058,697 A | 12/1977 | Sokolov et al. | |
| 4,327,273 A | 4/1982 | Kita et al. | |
| 4,677,273 A | 6/1987 | Colegrove et al. | |
| 4,698,546 A | 10/1987 | Maitland et al. | |
| 5,207,371 A | 5/1993 | Prinz et al. | |
| 5,278,390 A * | 1/1994 | Blankenship | B23K 9/0953 |
| | | | 219/130.5 |
| 5,321,224 A | 6/1994 | Kamimura et al. | |
| 5,343,016 A * | 8/1994 | Davis | B23K 9/067 |
| | | | 219/130.4 |
| 5,486,676 A | 1/1996 | Aleshin | |
| 5,714,735 A * | 2/1998 | Offer | B23K 9/1093 |
| | | | 219/136 |
| 6,046,426 A | 4/2000 | Jeantette et al. | |
| 6,215,092 B1 | 4/2001 | Goudeau et al. | |
| 6,268,584 B1 | 7/2001 | Keicher et al. | |
| 6,608,281 B2 | 8/2003 | Ishide et al. | |
| 6,693,252 B2 | 2/2004 | Zhang et al. | |
| 6,774,338 B2 | 8/2004 | Baker et al. | |
| 6,882,095 B2 | 4/2005 | Avnery | |
| 6,972,390 B2 | 12/2005 | Hu et al. | |
| 7,073,561 B1 | 7/2006 | Henn | |
| 7,168,935 B1 | 1/2007 | Taminger et al. | |
| 7,220,935 B2 | 5/2007 | Ireland et al. | |
| 9,145,832 B2 | 9/2015 | Comon et al. | |
| 2004/0084423 A1 | 5/2004 | Grossklaus, Jr. et al. | |
| 2005/0056628 A1 | 3/2005 | Hu | |
| 2005/0173380 A1 | 8/2005 | Carbone | |
| 2006/0065650 A1 | 3/2006 | Guo | |
| 2006/0185473 A1 | 8/2006 | Withers et al. | |
| 2006/0215246 A1 | 8/2006 | Kerekes et al. | |
| 2008/0201008 A1 | 8/2008 | Twelves et al. | |
| 2008/0286139 A1 | 11/2008 | Abe et al. | |
| 2009/0032310 A1 | 2/2009 | Stevens et al. | |
| 2010/0176109 A1* | 7/2010 | Peters | B23K 9/04 |
| | | | 219/137.61 |
| 2010/0193480 A1 | 8/2010 | Adams | |
| 2010/0260410 A1 | 10/2010 | Taminger et al. | |
| 2010/0270274 A1 | 10/2010 | Taminger et al. | |
| 2010/0276396 A1 | 11/2010 | Cooper et al. | |
| 2011/0170977 A1 | 7/2011 | Vagt et al. | |
| 2012/0193335 A1 | 8/2012 | Guldberg | |
| 2013/0140280 A1 | 6/2013 | Biskup et al. | |
| 2015/0328718 A1 | 11/2015 | Iwatani et al. | |

FOREIGN PATENT DOCUMENTS

| | | | |
|---|---|---|---|
| CN | 101163638 A | 4/2008 | |
| CN | 202344111 * | 7/2012 | ............... B23K 9/18 |
| CN | 103221174 A | 7/2013 | |
| CN | 104400188 A | 3/2015 | |
| CN | 104625412 A | 5/2015 | |
| CN | 105414764 A | 3/2016 | |
| CN | 105458470 A | 4/2016 | |
| EP | 0221752 A2 | 5/1987 | |
| EP | 0434246 B1 | 6/1991 | |
| EP | 1637274 | 3/2006 | |
| EP | 2119530 | 11/2009 | |
| GB | 2452600 A | 3/2009 | |
| GB | 2472783 A | 2/2011 | |
| GB | 2489493 B | 3/2011 | |
| JP | S47-000727 | 1/1972 | |
| JP | S53-054134 | 5/1978 | |
| JP | 55001939 | 1/1980 | |
| JP | S61-086075 | 1/1986 | |
| JP | 61296976 | 12/1986 | |
| JP | 04-55065 | 2/1992 | |
| JP | 04-59186 | 2/1992 | |
| JP | H04-055065 | 2/1992 | |
| JP | H04-000362 | 6/1992 | |
| JP | 6075792 | 9/1994 | |
| JP | 2729247 | 3/1998 | |
| JP | 2003-501336 | 1/2003 | |
| JP | 2009-534535 | 9/2009 | |
| JP | 2011050982 | 3/2011 | |
| JP | 2012086235 | 5/2012 | |
| WO | 200075084 A1 | 12/2000 | |
| WO | 2006133034 A1 | 12/2006 | |
| WO | 2007048144 A2 | 7/2007 | |
| WO | 2007124310 A2 | 11/2007 | |
| WO | 2009020901 A1 | 2/2009 | |
| WO | 2010003882 A2 | 1/2010 | |
| WO | 2011019287 | 2/2011 | |
| WO | 2011019287 A2 | 2/2011 | |
| WO | 2014025432 | 2/2014 | |
| WO | 2015120168 | 8/2015 | |

OTHER PUBLICATIONS

Taminger, K.M. and Hafley R.A., "Electron Beam Freeform Fabrication for Cost Effective Near-Net Shape Manufacturing", NATO/RTOACT-139 Specialists' Meeting on Cost Effective Manufacture via Net Shape Processing (Amsterdam, the Netherlands 2006) (NATO).

Xiong et al., "A new method of direct metal prototyping: hybrid plasma deposition and milling", Rapid Prototyping Journal, Jan. 2008, vol. 14, No. 1, pp. 53-56.

Taminger, K.M. and Hafley, R.A., "Characterization of 2219 Aluminum Produced by Electron Beam Freeform Fabrication", NASA Langley Research Center, pp. 482-489.

Taminger, K.M. and Hafley R.A., "Electron Beam Freeform Fabrication: A Rapid Metal Deposition Process", NASA Langley Research

(56) References Cited

OTHER PUBLICATIONS

Center, Proceedings of the 3rd Annual Automotive Composited Conference, Sep. 9-10, 2003, Troy, MI. Society of Plastics Engineers (2003), pp. 1-6.
CN Office Action dated Nov. 30, 2020 issued in the counterpart Chinese Application Serial No. 201780042296.5, with translation, 14 pages.
Search Report dated Nov. 22, 2020 issued in the counterpart Chinese Application Serial No. 201780042296.5, with translation, 6 pages.
Chinese Office Action dated Jul. 21, 2021 for counterpart Chinese Patent Application No. 201780042296.5, 5 pages (Translation Attached).

* cited by examiner

METHOD AND ARRANGEMENT FOR BUILDING METALLIC OBJECTS BY SOLID FREEFORM FABRICATION

RELATED APPLICATIONS

This application is a continuation-in-part of prior U.S. patent application Ser. No. 14/008,307, titled "METHOD AND ARRANGEMENT FOR BUILDING METALLIC OBJECTS BY SOLID FREEFORM FABRICATION," filed Sep. 27, 2013, which is the U.S. National Stage of International Patent Application Number PCT/NO2012/000033, titled "METHOD AND ARRANGEMENT FOR BUILDING METALLIC OBJECTS BY SOLID FREEFORM FABRICATION," having an international filing date of Mar. 30, 2012, which claims priority to Great Britain Patent Application Number GB 1105433.5, titled "METHOD AND ARRANGEMENT FOR BUILDING METALLIC OBJECTS BY SOLID FREEFORM FABRICATION," filed Mar. 31, 2011, the subject matter of each of which is incorporated herein by reference in its entirety.

FIELD OF THE INVENTION

The present relates to a method and arrangement for manufacturing objects by solid freeform fabrication, especially titanium and titanium alloy objects.

BACKGROUND OF THE INVENTION

Structured metal parts made of titanium or titanium alloys are conventionally made by casting, forging or machining from a billet. These techniques have a disadvantage of high material use of the expensive titanium metal and large lead times in the fabrication.

Fully dense physical objects may be made by a manufacturing technology known as rapid prototyping, rapid manufacturing, layered manufacturing, solid freeform fabrication (SFFF), additive fabrication, additive manufacturing and 3D printing. This technique employs computer aided design (CAD) software to first construct a virtual model of the object which is to be made, and then transform the virtual model into thin parallel slices or layers, usually horizontally oriented. The physical object may then be made by laying down successive layers of raw material in the form of liquid, paste, powder or other layerable, spreadable or fluid form, such as melted metal, e.g., from a melted welding wire, or preformed as sheet material resembling the shape of the virtual layers until the entire object is formed. The layers can be fused together to form a solid dense object.

Solid freeform fabrication is a flexible technique allowing creation of objects of almost any shape at relatively fast production rates, typically varying from some hours to several days for each object. The technique is thus suited for formation of prototypes and small production series, and can be scaled-up for large volume production.

The technique of layered manufacturing may be expanded to include deposition of pieces of the construction material, that is, each structural layer of the virtual model of the object is divided into a set of pieces which when laid side by side form the layer. This allows forming metallic objects by welding a wire onto a substrate in successive stripes forming each layer according to the virtual layered model of the object, and repeating the process for each layer until the entire physical object is formed. The accuracy of the welding technique is usually too coarse to allow directly forming the object with acceptable dimensions. The formed object will thus usually be considered a green object or pre-form which needs to be machined to acceptable dimensional accuracy.

Electron beam freeform manufacturing is known in the art (e.g., see Taminger et al. ("*Characterization of 2219 Aluminum Produced by Electron Beam Freeform Fabrication,*" Presented at the 13th Solid Freeform Fabrication Symposium, Aug. 5-7, 2002, Austin, Tex.; In proceedings, University of Texas at Austin (2002); Taminger et al. ("*Electron Beam Freeform Fabrication: A Rapid Metal Deposition Process,*" Proceedings of the 3rd Annual Automotive Composites Conference, Sep. 9-10, 2003, Troy, Mich., Society of Plastics Engineers (2003); and Taminger and Hafley ("*Electron Beam Freeform Fabrication for Cost Effective Near Net Shape Manufacturing*", NATO/RTOAVT-139 Specialists' Meeting on Cost Effective Manufacture via Net Shape Processing (Amsterdam, the Netherlands, 2006) (NATO). pp. 9-25)). Taminger and Hafley (2006) describes a method and device for manufacturing structural metal parts directly from computer aided design data combined with electron beam freeform fabrication (EBF). The structural part is built by welding on successive layers of a metallic welding wire which is welded by the heat energy provided by the electron beam. The EBF process involves feeding a metal wire onto a preheated area or molten pool made and sustained by a focused electron beam in a high vacuum environment. The positioning of the electron beam and welding wire is obtained by having the electron beam gun and the actuator supporting the substrate movably hinged along one or more axis (X, Y, Z, and rotation) and regulate the position of the electron beam gun and the support substrate by a four axis motion control system. The process is claimed to be nearly 100% efficient in material use and 95% effective in power consumption. The method may be employed both for bulk metal deposition and finer detailed depositions, and the method is claimed to obtain significant effect on lead time reduction and lower material and machining costs as compared to the conventional approach of machining the metal parts.

It is known to use a plasma arc to provide the heat for welding metallic materials. This method may be employed at atmospheric or higher pressures, and thus allow the use of simpler and less costly process equipment. One such method is known as gas tungsten arc welding (GTAW, also denoted as tungsten inert gas (TIG) welding) where a plasma transferred arc is formed between a non-consumable tungsten electrode and the welding area. The plasma arc is usually protected by a gas being fed through the plasma torch forming a protective cover around the arc. TIG welding may include feeding a metal wire or metal powder into the melting pool or the plasma arc as a filler material.

It is known (e.g., see Adams, U.S. Pat. Pub. No. 2010/0193480) to use a TIG-welding torch to build objects by solid freeform fabrication (SFFF), where successive layers of metallic feedstock material with low ductility are applied onto a substrate. A plasma stream is created by energizing a flowing gas using an arc electrode, the arc electrode having a variable magnitude current supplied thereto. The plasma stream is directed to a predetermined targeted region to preheat the predetermined targeted region prior to deposition. The current is adjusted and the feedstock material, such as a metal wire, is introduced into the plasma stream to deposit molten feedstock in the predetermined targeted region. The current is adjusted and the molten feedstock is slowly cooled at an elevated temperature, typically above the brittle to ductile transition temperature of the feedstock material, in a cooling phase to minimize the occurrence of material stresses.

Withers et al. (U.S. Pat. Pub. No. 2006/185473) also describes using a TIG torch in place of the expensive laser traditionally used in a SFFF process with relatively low cost titanium feed material by combining the titanium feed and alloying components in a way that considerably reduces the cost of the raw materials. Withers et al. teaches that an unalloyed commercially pure titanium wire (CP Ti wire) which is lower in cost than alloyed wire can be used, and the CP Ti wire can be combined with powdered alloying components in-situ in the SFFF process by combining the CP Ti wire and the powder alloying components in the melt of the welding torch or other high power energy beam. Wither et al. also teaches that titanium sponge material can be mixed with alloying elements and formed into a wire where it may be used in an SFFF process in combination with a plasma welding torch or other high power energy beam to produce near net shaped titanium components.

Abbott et al. (WO 2006/133034, 2006) describes a direct metal deposition process using a laser/arc hybrid process to manufacture complex three-dimensional shapes comprising the steps of providing a substrate and depositing a first molten metal layer on the substrate from a metal feedstock using laser radiation and an electric arc. The electric arc can be provided by gas metal arc welding torch using the metal feedstock as an electrode. Abbott et al. teaches that the use of laser radiation in combination with gas metal arc welding stabilizes the arc and purportedly provides higher processing rates. Abbott et al. utilizes a consumable electrode guided by and exiting out of a wire guide. The metal of the consumable electrode is melted at the end and the molten metal is deposited by positioning the end over the deposition point. The required heat for melting the consumable electrode can be supplied by an electric arc expanding between the tip of the electrode and the workpiece/deposition substrate, and by a laser irradiating the deposition area. Welding by melting a consumable electrode heated by an electric arc is known as gas metal arc welding (GMAW), of which in the case of using non-reactive gases to make the arc is also denoted as metal inert gas welding (MIG-welding).

Titanium metal or titanium alloys heated above 400° C. may be subject to oxidation upon contact with oxygen. It is thus necessary to protect the weld and heated object which is being formed by layered freeform manufacture against oxygen in the ambient atmosphere.

One solution to this problem is taught by Guldberg (WO 2011/019287), which discloses a method for increasing the deposition rate by performing the manufacturing of objects by SFFF, especially titanium and titanium alloy objects, in a reactor chamber which is closed to the ambient atmosphere. By making the deposition chamber sufficiently void of oxygen, the need for employing protective measures to avoid oxidizing the newly welded area by ambient atmospheric oxygen is no longer present, such that the welding process may proceed at a larger velocity since the welded zone may be allowed to have a higher temperature without risking excessive oxidation of the weld. For example, in production of objects of titanium or titanium alloy, there is no longer need for cooling the welded zone to below 400° C. to avoid oxidation.

Another solution for increasing the deposition rate is known from Keicher et al. (U.S. Pat. No. 6,268,584), which discloses a deposition head assembly consisting of the following features: an array of output powder nozzles for creating a converging flow of powder to the deposition region, a central orifice which allows the multiple beams to be focused onto the deposition substrate, and coaxial gas flow for each of the powder nozzles to concentrate the stream of powders from these nozzles in order to provide a longer working distance between the nozzle and the deposition head assembly. The longer working distance is critical to insure that molten metal particulates are not attached to the deposition apparatus during processing. In particular, Keicher et al. describes a manifold system designed into the deposition head assembly that can use more than one laser beam simultaneously for the deposition process. The deposition head assembly also incorporates a means for actively concentrating the powder stream from each orifice to increase material utilization efficiency.

Another solution to the problems associated with the reactive nature of molten Ti is described by Abbott et al. (WO 2006/133034), which describes using a combination of a gas metal arc and laser welding. Gas metal arc techniques have several disadvantages that severely limit their application to depositing Ti. These drawbacks include instabilities in metal transfer, excessive spatter, and poor control of the deposited layer shape, and high heat input that causes distortion of thin sections during deposition. Also, an increase in productivity is not possible because of wandering of the cathode spot that occurs during deposition. The solution to these problems according to Abbott et al. is to a direct metal deposition process that includes the steps of providing a substrate and depositing a metal from a metal feedstock onto the substrate. An electric arc is generated between the metal feedstock and the substrate and the arc is exposed to laser radiation to form a molten metal pool on the substrate. The molten metal pool is cooled to form a first solid metal layer on the substrate.

A problem to be addressed is the speed of deposition of material on the base material to form the workpiece. One could increase the temperature of the metal wire to preheat the metal wire so that it melts at a faster rate. However, higher temperatures can result in spray transfer or spatter or an uncontrolled molten metal addition from the melted electrode into the molten metal pool, resulting in poor deposition and lack of control of the shape of the deposited layer. Excessive temperatures of the preheated area or molten pool also can result in distortion of the thin sections during deposition.

Accordingly, there exists a need in this art for an economical method of performing direct metal deposition at an increased rate of metal deposition. There further exists a need in this art for a method of increasing throughput and yield of direct metal deposition formed products.

SUMMARY OF THE INVENTION

An objective of the present invention is to provide a device for building metallic objects by SFFF.

Another objective of the invention is to provide a method for rapid layered manufacture of objects in titanium or titanium alloys.

This invention addresses the needs for an improved, economical method of performing direct metal deposition. This invention further addresses the need for a method of increasing throughput and yield of distortion-free direct metal deposition formed parts with smooth, well-defined deposition boundaries.

The invention is based on the realization that the deposition rate may be increased by use of a two gun system, which can include, e.g., a first welding gun for pre-heating the target deposition area on the base material, and a second welding gun for heating and melting a metal wire. Various combinations of first and second welding guns can be used. The first welding gun can include a laser device for pre-heating the target deposition area on the base material, and the second welding gun can include a plasma arc welding (PAW) torch, such as a plasma transferred arc (PTA) torch, for heating and melting a metal wire onto the target deposition area on the base material. The first welding gun can include a PAW torch, such as a PTA torch for pre-heating the target deposition area on the base material, and the second welding gun can include a laser device for heating and melting a metal wire onto the target deposition area on the base material. The first welding gun can include a first laser device for pre-heating the target deposition area on the base material, and the second welding gun can include a second laser device for heating and melting a metal wire onto the target deposition area on the base material. The first welding gun can include a laser device for pre-heating the target deposition area on the base material, and the second welding gun can include a coaxial powder feed nozzle laser system for heating and melting metal powder onto the target deposition area on the base material. The first welding gun can include an electron beam device for pre-heating the target deposition area on the base material, and the second welding gun can include a laser device for heating and melting a metal wire onto the target deposition area on the base material. The first welding gun can include a laser device for pre-heating the target deposition area on the base material, and the second welding gun can include an electron beam device for heating and melting a metal wire onto the target deposition area on the base material. The first welding gun can include a first electron beam device for pre-heating the target deposition area on the base material, and the second welding gun can include second electron beam device for heating and melting a metal wire onto the target deposition area on the base material.

Provided herein are systems for building metallic objects by solid freeform fabrication, the systems including a first welding gun for pre-heating the base material at a position at which the metallic material is to be deposited; a second welding gun to melt a source of metal into droplets of metallic material that are deposited onto the preheated area of the base material; an actuator tray that moves the base material relative to at least the first welding gun, or an actuator arm that moves the first welding gun, or an actuator arm that moves the second welding gun, or any combination of these actuators; and a control system able to read a computer assisted design (CAD) model of the object to be formed and employ a CAD-model to regulate the position and movement of the system for positioning and moving the base material and to operate the welding guns such that a physical object is built by fusing successive deposits of the metallic material onto the base material.

The first welding gun preheats the base material so that it is receptive to molten drops of melted metal wire at the position at which the melted metallic material is to be deposited. In some embodiments, at least a portion of the base material can be melted by the first welding gun to make the base material more receptive. In some embodiments, sufficient heat is applied by the first welding gun to form a preheated area in the base material at the position at which the metallic material is to be deposited. In some embodiments, sufficient heat is applied by the second welding gun to form a molten pool in the base material at the position at which the metallic material is to be deposited. It is noted that although the invention is described in correlation with the use of a metal wire, any conductive structure that can be guided and melted to deposit material can be used, for example any consumable electrode of appropriate size and shape can be used.

The first welding gun can promote fusion between the base material and the melted metallic material by deepening the melt-in in the base material. The first welding gun can help to ensure adequate melt-in by the superheated melted metallic material that the melted metallic material may not be able to achieve by itself.

The system can include a PAW torch, such as a PTA torch, as the first welding gun and a laser device as the second welding gun. In such systems, the PAW torch can be electrically connected to a direct current power source such that the electrode of the PAW torch becomes the cathode and the metal wire becomes the anode.

The second welding gun can also be designed to contribute thermal energy in the preheated area. Also, the first welding gun and second welding guns can be located on the opposite sides of the base material.

Also provided are methods for manufacturing a three-dimensional object of a metallic material by solid freeform fabrication, where the object is made by fusing together successive deposits of the metallic material onto a base material, the methods including using a first welding gun to preheat at least a portion of the surface of the base material, e.g., at the position at which the metallic material is to be deposited; using a second welding gun to heat and melt a metallic material such that molten metallic material is deposited onto the preheated area of the base material, and moving the base material relative to the position of the first and second welding guns in a predetermined pattern such that the successive deposits of molten metallic material solidifies and forms the three-dimensional object.

The methods provided herein can utilize a PAW torch, such as a PTA torch, as the first welding gun and a laser device as the second welding gun. The methods provided herein can utilize a laser device as the first welding gun and a PAW torch as the second welding gun. In such systems, the PAW torch can be electrically connected to a direct current power source such that the electrode of the PAW torch becomes the cathode and the metal wire becomes the anode.

The methods provided herein can utilize a first laser device as the first welding gun, and a second laser device as the second welding gun. The methods provided herein can utilize a laser device as the first welding gun, and a coaxial powder feed nozzle laser system as the second welding gun. The methods provided herein can utilize an electron beam device as the first welding gun, and a laser device as the second welding gun. The methods provided herein can utilize a laser device as the first welding gun, and an electron beam device as the second welding gun. The methods provided herein can utilize an electron beam device as the first welding gun, and a laser device as the second welding gun. The methods provided herein can utilize a first electron beam device as the first welding gun, and a second electron beam device as the second welding gun.

Additional features and advantages of the invention will be set forth in the description which follows, and in part will be apparent from the description, or can be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. For clarity, the figures are not to scale and some components are omitted.

In the drawings.

DETAILED DESCRIPTION

A. Definitions

Figure 1:
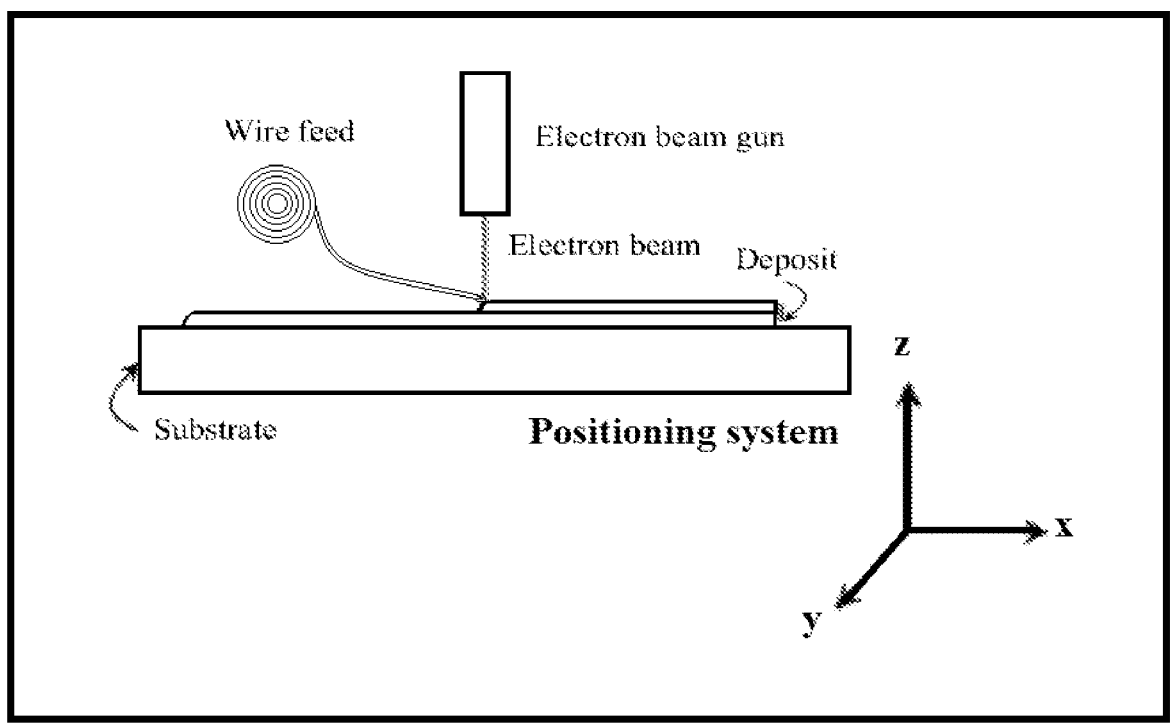
FIG. 1 is a facsimile of FIG. 1 of Taminger and Hafley ("*Electron Beam Freeform Fabrication for Cost Effective Near-Net Shape Manufacturing*," NATO/RTOAVT-139 Specialists' Meeting on Cost Effective Manufacture via Net Shape Processing (Amsterdam, the Netherlands, 2006) (NATO), pp. 9-25) showing a schematic view of the principle of solid freeform fabrication.
Figure 2:
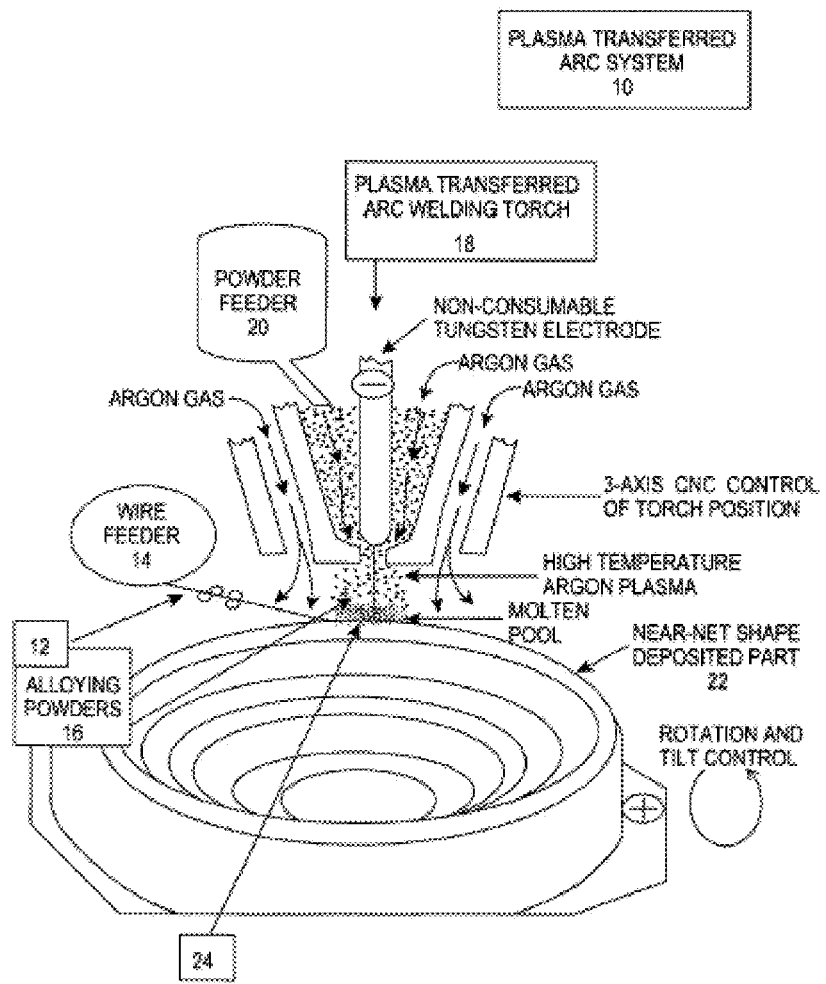
FIG. 2 is a facsimile of FIG. 1 of US 2006/0185473 showing a schematic view of the principle of plasma transferred arc solid freeform fabrication.

Unless defined otherwise, all technical and scientific terms used herein have the same meaning as is commonly understood by one of skill in the art to which the inventions belong. All patents, patent applications, published applications and publications, websites and other published materials referred to throughout the entire disclosure herein, unless noted otherwise, are incorporated by reference in their entirety. In the event that there are a plurality of definitions for terms herein, those in this section prevail. Where reference is made to a URL or other such identifier or address, it is understood that such identifiers can change and particular information on the internet can come and go, but equivalent information can be found by searching the internet. Reference thereto evidences the availability and public dissemination of such information.

As used here, the singular forms "a," "an" and "the" include plural referents unless the context clearly dictates otherwise.

As used herein, ranges and amounts can be expressed as "about" a particular value or range. "About" also includes the exact amount. Hence "about 5 percent" means "about 5 percent" and also "5 percent." "About" means within typical experimental error for the application or purpose intended.

As used herein, the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

As used herein, "optional" or "optionally" means that the subsequently described event or circumstance does or does not occur, and that the description includes instances where the event or circumstance occurs and instances where it does not. For example, an optional component in a system means that the component may be present or may not be present in the system.

As used herein, a "combination" refers to any association between two items or among more than two items. The association can be spatial or refer to the use of the two or more items for a common purpose.

As used herein, a "Plasma Arc Welding torch" or "PAW torch" refers to a welding torch that can be used in plasma arc welding. The torch is designed so that a gas can be heated to a high temperature to form plasma and becomes electrically conductive, the plasma then transfers an electric arc to a workpiece, and the intense heat of the arc can melt metal and/or fuse two pieces of metal together. A PAW torch can include a nozzle for constricting the arc thereby increasing the power density of the arc. The plasma gas typically is argon. Plasma gas can be fed along the electrode and ionized and accelerated in the vicinity of a cathode. The arc can be directed towards the workpiece and is more stable than a free burning arc (such as in a TIG torch). The PAW torch also typically has an outer nozzle for providing a shielding gas. The shielding gas can be argon, helium or combinations thereof, and the shielding gas assists minimizing oxidation of the molten metal. In a PAW torch, the current typically can be up to about 400 A, and the voltage typically can be between about 25-35 V (but can be up to app. 14 kW). The invention is not tied to any specific choice or type of PAW torch. Any known or conceivable device able to function as PTA torch can be used. An exemplary PAW torches is a plasma transferred arc (PTA) torch.

The term "plasma transferred arc torch" or "PTA torch" as used interchangeably herein refers to any device able to heat and excite a stream of inert gas to plasma by an electric arc discharge and then transfer the flow of plasma gas including the electric arc out through an orifice (such as a nozzle) to form a constricted plume that extends out of the orifice and transfers the intense heat of the arc to a target region. The electrode and target region can be electrically connected to a direct current power source such that the electrode of the PTA torch becomes the cathode and the target region becomes the anode. This will ensure that the plasma plume including electric arc is delivering a highly concentrated heat flow to a small surface area of the target region with excellent control of the areal extension and magnitude of the heat flux being supplied from the PTA torch. A plasma transferred arc has the advantage of providing stable and consistent arcs with little wandering and good tolerance for length deviations between the cathode and anode. Thus, the PTA torch is suitable both for pre-heating a surface, and in some applications forming a preheated area or molten pool in the base material, as well as to heat and melt the metallic wire feed. The PTA torch may advantageously have an electrode made of tungsten and a nozzle made of copper. However, the invention is not tied to any specific choice or type of PTA torch. Any known or conceivable device able to function as PTA torch can be used.

The term "power density" as sued herein refers to an amount of power that is distributed to a unit area from a laser beam or electron beam.

As used herein, "SFFF" refers to solid free form fabrication.

The term "metallic material" as used herein refers to any known or conceivable metal or metal alloy that may be formed into a wire and employed in a solid freeform fabrication process to form a three-dimensional object. Examples of suitable materials include, but are not limited to; titanium and titanium alloys such as i.e. Ti-6Al-4V alloys.

The term "similar metallic material" as used herein means that the metallic material is of the same metal or metal alloy as the reference metallic material.

The term "holding substrate" as used herein refers to the target substrate upon which additional material, the same or different from that of the holding substrate, is deposited using the technique of SFFF or solid free form fabrication to form a workpiece. In exemplary embodiments, the holding substrate is a flat sheet. In alternative embodiments, the holding substrate may be a forged part. In alternative embodiments, the holding substrate may be an object upon which additional material is to be deposited. In exemplary embodiments, the holding substrate can become part of the workpiece. The material for the holding substrate can be a metal or a metal alloy. In exemplary embodiments, the holding substrate is made of the same metal as the wire feed material.

The term "base material" as used herein refers to the target material for receiving molten metallic material for forming a three-dimensional object. The base material will be the holding substrate when depositing the first layer of metallic material. When one or more layers of metallic material have been deposited onto the holding substrate, the base material will be the upper layer of deposited metallic material that is to have deposited a new layer of metallic material. As used herein, the term "workpiece" refers to a metal body being produced using solid free form fabrication.

The term "computer assisted design model" or "CAD-model" as used interchangeably herein refers to any known or conceivable virtual three-dimensional representation of the object that is to be formed which may be employed in the control system of the arrangement according to the second aspect of the invention: to regulate the position and movement of the holding substrate and to operate the welding torch with integrated wire feeder such that a physical object is built by fusing successive deposits of the metallic material onto the holding substrate in a pattern which results in building a physical object according to the virtual three-dimensional model of the object. This may for instance be obtained by forming a virtual vectorized layered model of the three-dimensional model by first dividing the virtual three-dimensional model into a set of virtual parallel layers and then dividing each of the parallel layers into a set of virtual quasi one-dimensional pieces. Then, the physical object may be formed by engaging the control system to deposit and fuse a series of quasi one-dimensional pieces of the metallic material feed onto the supporting substrate in a pattern according to the first layer of the virtual vectorized layered model of the object. Then, repeating the sequence for the second layer of the object by depositing and fusing a series of quasi one-dimensional pieces of the weldable material onto the previous deposited layer in a pattern according to the second layer of the virtual vectorized layered model of the object. Repetition continues the deposition and fusing process layer by layer for each successive layer of the virtual vectorized layered model of the object until the entire object is formed. However, the invention is not tied to any specific CAD-model and/or computer software for running the control system of the arrangement according to the invention, and nor is the invention tied to any specific type of control system. Any known or conceivable control system (CAD-model, computer-aided manufacturing (CAM) system or software, computer software, computer hardware and actuators etc.) able to build metallic three-dimensional objects by solid freeform fabrication may be used as long as the control system is adjusted to separately operate one first PTA torch to form the preheated area or molten pool and a second PTA torch to melt the feed wire of metallic material into the molten pool.

B. Two Welding Gun Systems

It has been determined that the deposition rate of molten metal to a forming workpiece can be increased using a two welding gun system in which a first welding gun preheats the base material to form a preheated area, and a second welding gun is used to heat and melt a metal onto the preheated area of the base material. As used herein the term "welding gun" or simply "gun" is used interchangeably and meant to refer to any heading devices or device that is able to emit heat or an heating energy source. Non-limiting examples of welding guns or guns include PAW torches, including PTA torches, laser emitting devices ("laser devices"), and electron beam emitting devices ("electron beam devices"). The first gun can ensure fusion between the base material or workpiece and the molten metal produced by the action of the second gun on a metal, such as a metal wire or metal powder. The first gun can deepen the melt-in of the molten metal into the preheated area of the base material. The superheat from the droplets of molten metal can maintain a melt pool in the vicinity of the preheated area of the base material. The pre-heating of the base material can lead to better wetting, better deposition profile and increased deposition rate. Regarding deposition profile, by pre-heating the substrate, it is possible to obtain a rounder and wider deposit profile. The improved profile can result in a profile with a beneficial angle towards the base material, which can promote fusion to the base material and previous metal depositions. Improved fusion yields a manufactured product with improved integrity.

Each of the welding guns includes a heating device. Each welding gun can be separately controlled, and each welding gun can be modulated to produce a separate temperature effect. An advantage of this arrangement is that the amount of thermal energy applied to the metallic feed stock to be melted onto the preheated area of the base material can be greater than that applied to the base material, avoiding over-heating of the base material.

In exemplary embodiments, one heating device used as a welding gun can be used to preheat the base material and optionally form a molten pool, while the other heating device used as another welding gun can be used solely to melt the metal wire or a consumable electrode. In alternative embodiments, the heating device used as a welding gun to melt the metal wire or a consumable electrode can also be used to further heat the base material at a location where the melted metal from the melting of the metal wire or a consumable electrode is to be deposited. The additional heating of the already preheated area or even molten pool can allow for better temperature control of the area over which metal is to be deposited thus further achieving the benefits of having a preheated area or a molten pool.

In exemplary embodiments, the heating device used as a welding gun to melt the metal wire or a consumable electrode can be a PAW torch (for example a PTA torch) where the torch is also connected to the same DC power as the base material. Accordingly, while being used to melt the metal wire, the torch can also become the cathode while the base material becomes the anode thereby delivering pulsating heat flux to the area of the base material in an area that was already preheated by the other heating device or gun and over which the metal wire is being melted and thus where metal is being deposited.

Similarly, this additional heating of the preheated area or of the melted pool in the base material can be accomplished using other types of heating devices or guns. For example, when using a laser device as the welding gun to melt the metal wire, the laser can be directed to the metal wire and the base material rather than directing it only toward the metal wire. Any known means for redirecting a laser can be used to direct the laser or split the laser and direct it toward the base material while still melting the metal wire. In an exemplary embodiment, one or more mirrors can be used to either split or reflect at least a portion of the laser so that the laser hits the metal wire and the base material rather than only the metal wire. Use of an electron beam device as the welding gun can also be employed to achieve this purpose. For example, the electron beam can be directed toward the metal wire to melt the metal wire and also to the base material to provide additional heat to the preheated area or molten pool. Any known way to direct the electron beam can be used.

Positioning of the base material and any one or more welding gun can be accomplished using one or more actuators. In exemplary embodiments, the base material can be repositioned or moved using an actuator tray over which the base material is resting. The actuator tray can move the base material in any direction. In exemplary embodiments the actuator tray can be set on a track or rail system and able to move the base material in any desired direction. Alternatively, the actuator tray may be operated using a mechanical or robotic arm. The actuator may also be operated using hydraulics. Similarly, the one or more welding guns may be moved using one or more actuators. For example, each of the one or more welding guns may be attached to an independently controlled actuator arm, such as a robotic or mechanical arm. The actuators may also be operated using hydraulics. Use of other types of mechanisms for the actuator arm can also be implemented, such as for example rail or track systems. In exemplary embodiments in which two or more welding guns are used, each welding gun can be moved independently. In alternative embodiment using two or more welding guns, the position of two or more welding guns can be fixed relative to each other and one or more actuator arms move the two or more welding guns simultaneously. In exemplary embodiments, the actuator tray is the only actuator used, keeping the one or more welding guns at a fixed position during deposition. In alternative embodiments, the actuator tray moves the base material only within two direction in one plane, while one or more actuator arms move the one or more welding guns in only one direction, for example perpendicularly to the plane in which the actuator tray moves. The opposite may also be true, where the one or more actuator arms move the one or more welding guns in two directions within a plane while and the actuator tray moves the base material along a single direction. In alternative embodiments, the base material is maintained in a fixed position during deposition, and one or more actuator arms are used to move the one or more welding guns. In yet an alternative embodiment, an actuator tray and one or more actuator arms are all used to move the base material and the one or more welding guns. A control system including for example a computer-aided manufacturing (CAM) system or software can be used to operate and regulate the engagement of one or more actuators that can constantly position and move either the base material, one or more welding guns, or a combination thereof such that the preheated area or molten pool is located at the intended deposition area as given by a CAD-model of the object that is to be formed.

The control system can include a computer processer or central processing unit (CPU), CPU display, one or more power supplies, power supply connections, signal modules as inputs and/or outputs, integrated shielding of analog signals, storage devices, circuit boards, memory chips or other storage medium, a non-transitory computer-readable storage medium having a computer-readable program embodied therein, or any combination thereof. The computer-readable program can contain appropriate software for partially or completely automating any one or combination of systems. The computer-readable program can contain appropriate software for monitoring and/or adjusting a parameter, such as temperature, pressure, position of the workpiece, deposition rate, or any combination thereof. Exemplary control systems include, but are not limited to, the SIMATIC-S7-1500 from Siemens AG (Munich, Germany), the IndraMotion MTX system available from Bosch Rexroth AG (Lohr am Main, Germany), and the SIGMATEK C-IPC compact industrial computer system available from SIGMATEK GmbH & Co. KG (Lamprechtshausen, Austria).

It is noted that although the embodiments described herein in accordance with illustrative examples in FIGS. 3-11 are shown with both welding guns on the same side of the base material, the invention is not so limited. In exemplary embodiments, the welding gun using to achieve the preheated area in the base material may alternatively be located on the opposite side of the base material from the welding gun used to melt the metal wire.

System Containing Two PTA-Torches

In an exemplary embodiment the present invention relates to a method for manufacturing a three-dimensional object of a metallic material by solid freeform fabrication, where the object is made by fusing together successive deposits of the metallic material onto a holding substrate, characterized in that the method comprises:

employing a holding substrate made of a similar metallic material as the object is to be made of, and each successive deposit is obtained by:

i) employing a first plasma transferred arc (PTA) to preheat and optionally form a molten pool in the base material at the position at which the metallic material is to be deposited, ii) feeding the metallic material to be deposited in the form of a wire to a position above the preheated area or molten pool, iii) employing a second plasma transferred arc (PTA) to heat and melt the wire such that molten metallic material is dripping onto the preheated area or molten pool, and iv) moving the holding substrate relative to the position of the first and second PTA in a predetermined pattern such that the successive deposits of molten metallic material solidifies and forms the three-dimensional object. In a second aspect the invention relates to an arrangement for manufacturing a three-dimensional object of a metallic material by solid freeform fabrication, where the arrangement comprises:

a welding torch with an integrated wire feeder feeding a wire of the metallic material, an actuator tray that moves the base material relative to at least the first heating device, or an actuator arm that moves the first heating device, or an actuator arm that moves the second heating device, or any combination of these actuators, and a control system able to read a computer assisted design (CAD) model of the object which is to be formed and employ the CAD-model to regulate the position and movement of the system for positioning and moving the holding substrate and to operate the welding torch with integrated wire feeder such that a physical object is built by fusing successive deposits of the metallic material onto the holding substrate, characterized in that the holding substrate is made of a similar metallic material as the object that is to be made, the welding torch comprises i) a first plasma transferred arc (PTA) torch electrically connected to the base material and ii) a second plasma transferred arc (PTA) torch electrically connected to the feed wire of metallic material, the control system is able to separately operate and regulate the first PTA-torch to form and maintain a preheated area or molten pool in the base material at the position at which the metallic material is to be deposited, and the control system is able to separately operate and regulate the wire feeder and the second PTA-torch to melt the metallic material feed in a position such that molten metallic material drips onto the preheated area or molten pool.

The use of a separately controlled first PTA-torch to preheat the base material or form the molten pool and a separately second PTA-torch to melt the feed wire of metallic material provides the advantage that it becomes possible to increase the heat supply to the feed of the metallic wire independently of the heat supply to the substrate such that it becomes possible to increase the heat flux into the feed material with no risk of creating a "spray arc" which generates spatter. Thus, it is possible to increase the deposition rate of the molten metallic feed material without simultaneously over-heating the substrate and without risk of spatter or form an excessive preheated area or molten pool and thus, loose control of the consolidation of the deposited material. This feature is obtained by connecting a direct current power source such that the electrode of the first PTA-torch becomes the negative polarity and the base material becomes the positive polarity to define an electric circuit where electric charge is transferred by an arc discharge between the electrode of the first PTA-torch and the base material, and by connecting the electrode of the second PTA-torch to the negative pole of a direct current power source and the feed wire of metallic material to the positive pole to form an electric circuit where electric charge is transferred by an arc discharge between the electrode of the second PTA-torch and the feed wire of metallic material.

The first and second PTA-torches may advantageously have separate power sources and means for regulating the power supply to the respective torches. The means for regulating the power may advantageously include means for monitoring the temperature of the deposition area of the base material and means for regulating the width and positioning of the arc such as i.e. magnetic arc deflection means. Also, the first PTA-torch employed to preheat the base material and optionally form the molten pool in the base material may advantageously form a wide arc, such as i.e. formed by a gas tungsten arc welding torch (GTAW-torch, also denoted as TIG-torch in the literature) to simply preheat or to form a molten pool in a wider area of the surface of the base material.

The feed rate (the wire speed) and positioning of the feed wire of metallic material may advantageously be controlled and regulated in accordance with the effect of the power supply to the second PTA-torch in order to ensure that the wire is being continuously heated and melted when reaching the intended position above the preheated area or molten pool in the base material. This may be obtained by using a conventional gas metal arc welding torch (GMAW-torch, also denoted MIG-torch) as wire feeder without forming an arc in the MIG-torch. This embodiment of the wire feeder has the advantage of being able to electrically connect the wire to the DC power supply of the second PTA-torch and also to position the wire very accurately. The feed wire of metallic material may have any practically implementable dimension, such as i.e. 1.0 mm, 1.6 mm, 2.4 mm, etc.

The supplied effect to the first and second PTA-torch will depend on which metallic material is being applied, the diameter of the feed wire, the heat tolerances of the base material, the deposition rate etc. The invention is therefore not tied to any specific window of power supply, but may apply any practically functioning potential difference and current which results in a functioning operation of the first and second PTA-torch. A skilled person will be able to find these parameters by trial and error tests. Experiments performed by the applicant has shown that by employing a wire with diameter of 1.6 mm made of grade 5 titanium alloy, it may be built three-dimensional objects with similar mechanical properties as conventional objects of titanium at a deposition rate of 3.7 to 3.8 kg/hour when the first PTA-torch is supplied with around 150 A and the second PTA-torch with around 250 A. It is believed that deposition rates up to 10 kg/hour may be obtained by performing the SFFF-deposition according to the first and second aspect of the invention in an effectively protected atmosphere, such as i.e. in the reaction chamber disclosed in WO 2011/0198287. This is confirmed by another experiment performed by the applicant with wire diameter 2.4 mm, grade 5 titanium, which gave a deposition rate of 9.7 kg/h when supplying the first PTA torch a current of around 250 A and the second PTA torch with a current of around 300 A.

As an alternative, the invention may also include means for creating thermal pulses in the preheated area or the molten pool in order to break down tendencies to growth of crystalline dendrites at that location. This feature allows forming metallic objects with enhanced mechanical properties due to an improved grain structure. The thermal pulsing may be obtained by employing a third DC power generator which delivers a pulsating DC-potential and connecting the negative pole of the DC power generator to the electrode of the second PTA-torch and the positive pole to the base material to form an electric circuit where electric charge is transferred by an pulsating arc discharge between the electrode of the second PTA-torch and the base material. The arc discharge between the electrode of the second PTA-torch and base material will be turned on and off in accordance with the applied pulsating DC-potential and thus form a pulsating heat flux into the preheated area or molten pool in the base material. The frequency of the pulsing may be in the range from 1 Hz up to several kHz or more, i.e. 10 kHz.

Figure 3:
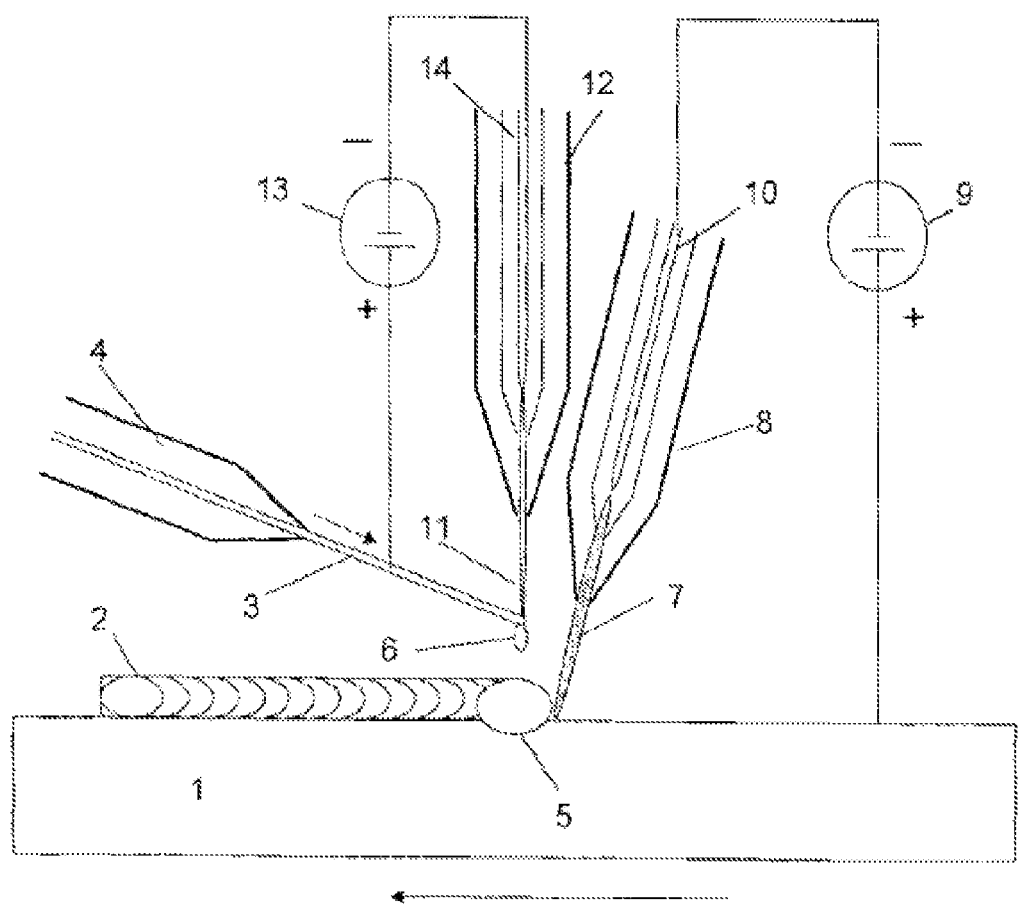
FIG. 3 is a schematic drawing showing a cross-section view of the arrangement according to the second aspect of the present invention.
Figure 4:
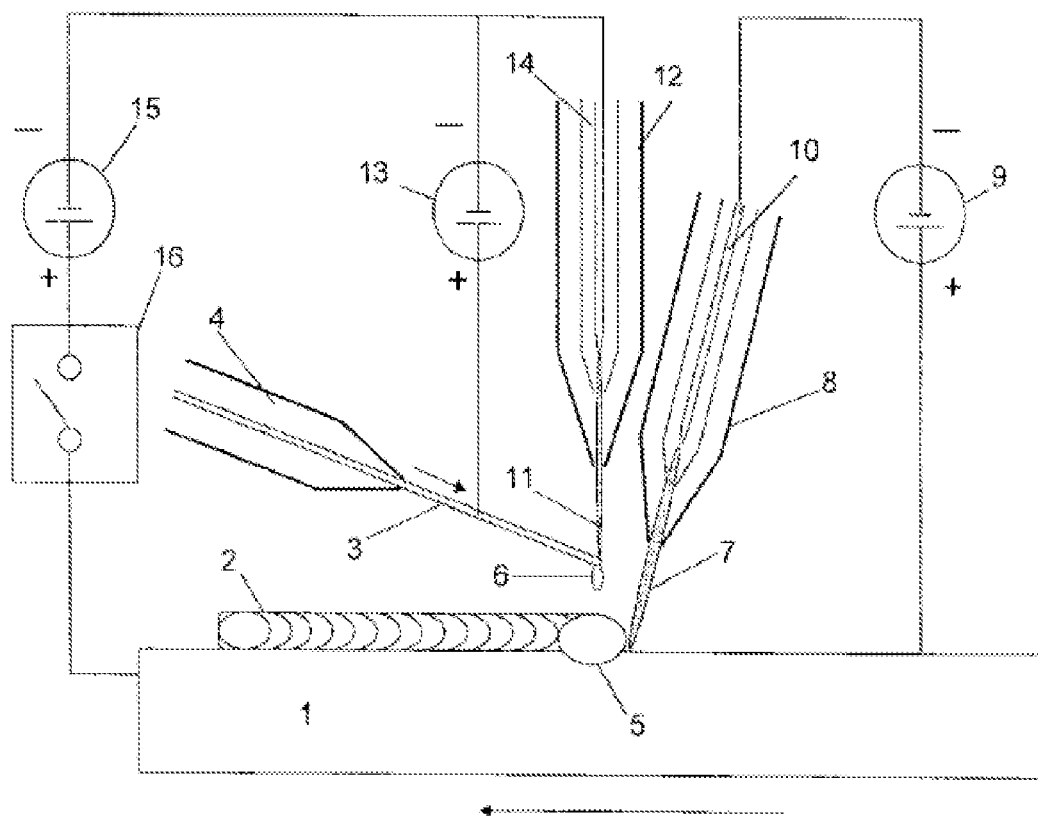
FIG. 4 is a schematic drawing showing a cross-section view of a second embodiment of the invention including thermal pulsing.
Figure 5:
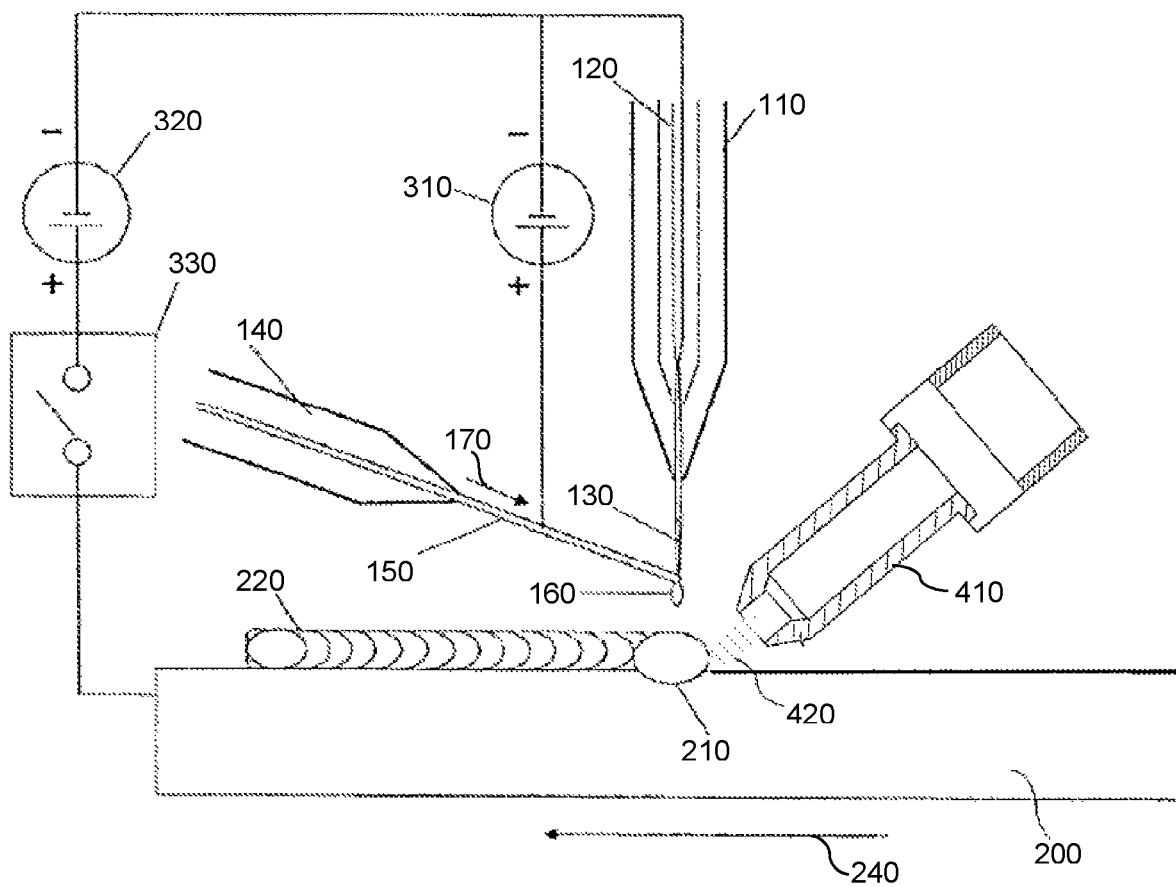
FIG. 5 is a schematic side view of an embodiment of the two gun system provided herein that includes a laser device for pre-heating the target deposition area on the base material, and a plasma transferred arc for heating and melting a metal wire onto the target deposition area on the base material.
Figure 6:
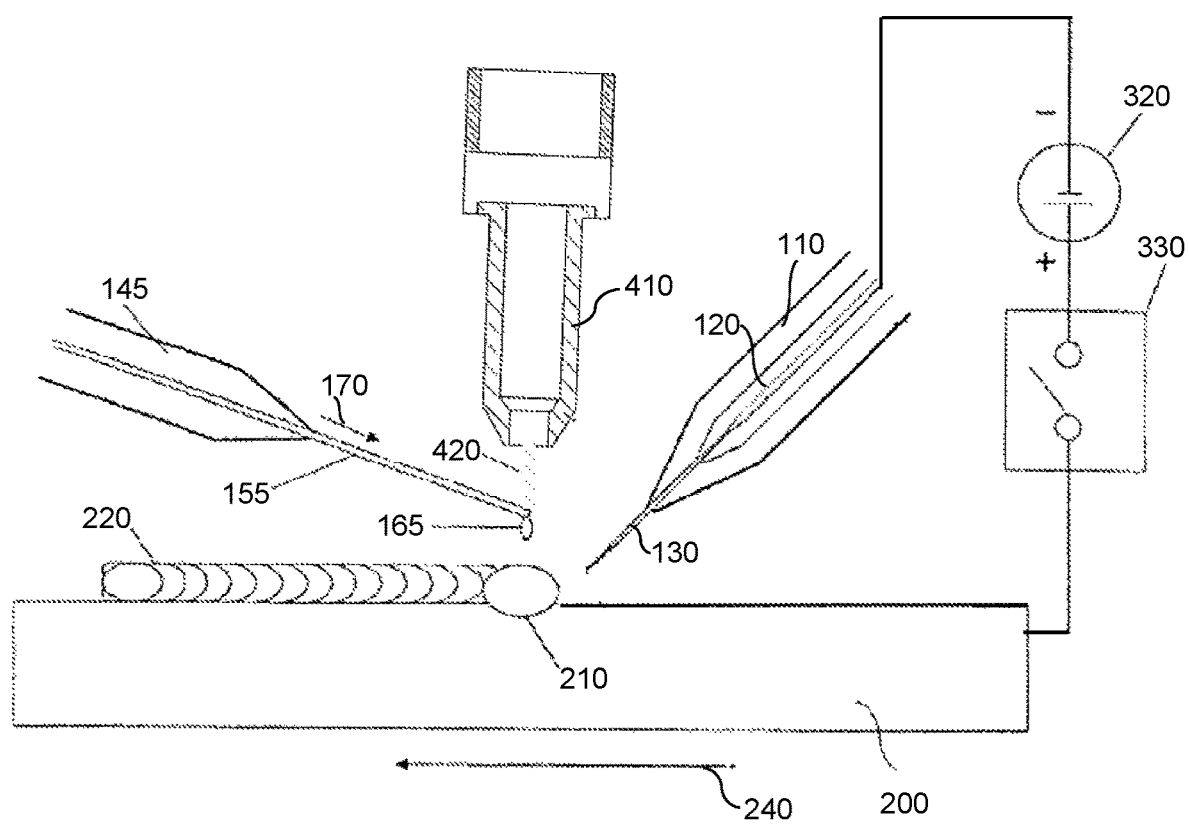
FIG. 6 is a schematic side view of an embodiment of the two gun system provided herein that includes a plasma transferred arc for pre-heating the target deposition area on the base material, and a laser device for heating and melting a metal wire onto the target deposition area on the base material.
Figure 7:
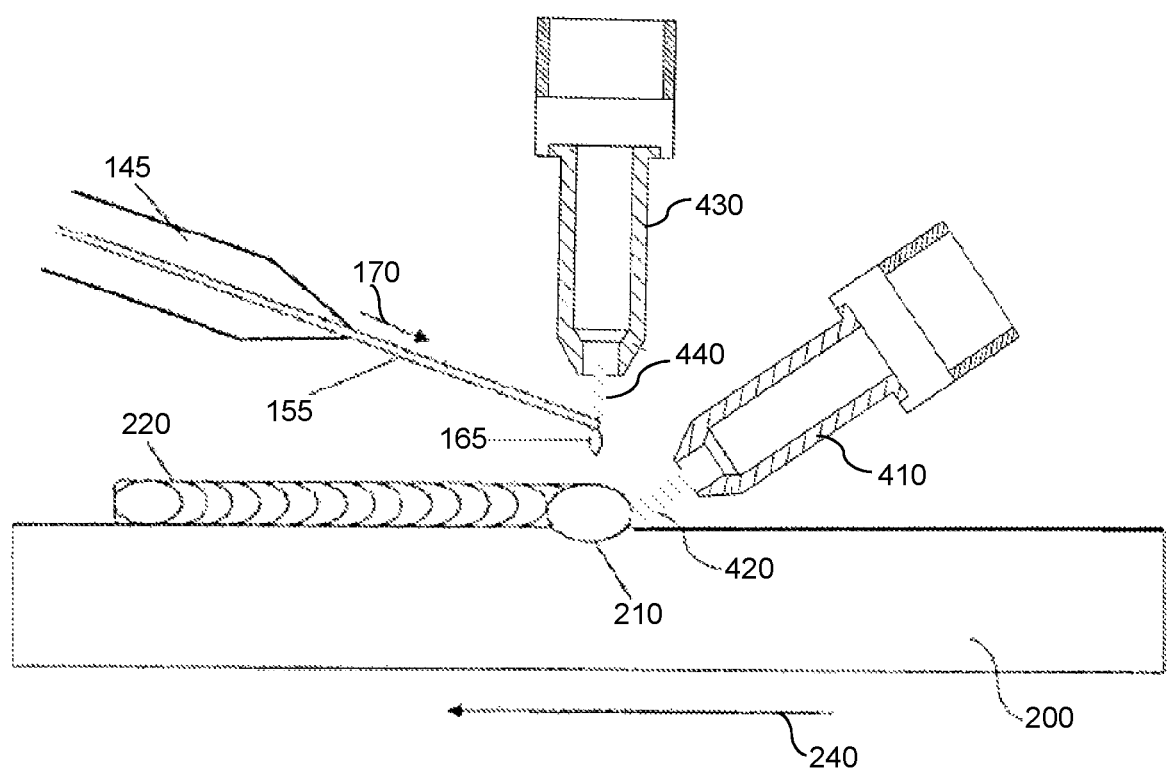
FIG. 7 is a schematic side view of an embodiment of the two gun system provided herein that includes a laser device for pre-heating the target deposition area on the base material, and a laser device for heating and melting a metal wire onto the target deposition area on the base material.

A first example embodiment of the arrangement according to second aspect of the invention is shown schematically in FIG. 3. The figure shows a holding substrate 1 made of a Ti-6Al-4V alloy shaped as a rectangular cuboid, onto which a three-dimensional object made of the same Ti-6Al-4V alloy is to be formed by solid freeform fabrication. The figure displays the initial part of the deposition process where the first welding stripe 2 of Ti-6Al-4V alloy is being deposited.

A wire 3 made of the Ti-6Al-4V alloy is continuously being supplied by a wire feeder 4 which positions the wire 3 such that its distal end is located above the preheated area or molten pool 5 at the deposition area on the holding substrate 1. The wire 3 is given a velocity indicated by the upper arrow on the Figure which corresponds to the heating and melting rate of the distal end such that droplets 6 of molten wire are continuously being supplied to the preheated area or molten pool 5.

A first plasma transferred arc 7 is formed by a PTA-torch 8 which is electrically connected to a DC power source 9 such that the electrode 10 of the PTA-torch becomes the cathode and the holding substrate 1 the anode. The plasma transferred arc 7 is continuous and directed to heat and optionally melt the base material (which at this stage of the SFFF-process is the holding substrate) at the deposition area such that the preheated area or molten pool 5 is obtained. The effect of the DC power source 9 is regulated to maintain a preheated area or molten pool 5 with a constant size and extension by a control system (not shown). The PTA-torch 8 is a gas tungsten arc welding (GTAW) torch equipped with a magnetic arc deflector (not shown) to control the size and position of the arc 8. A second plasma transferred arc 11 is formed by a PTA-torch 12 which is electrically connected to a DC power source 13 such that the electrode 14 of the PTA-torch 12 becomes the cathode and the feed wire 3 the anode. The plasma transferred arc 11 is continuous and directed to heat and melt the distal end of the wire 3. The effect of the DC power source 13 is regulated to maintain a heating and melting rate in accordance with the feeding velocity of the wire such that the formation of the droplets 6 are timed to maintain a continuous drip of molten wire onto the preheated area or the molten pool 5. The effect supplied by the DC power source 13 and the feeding velocity of the wire 3 exiting the wire feeder 4 are constantly regulated and controlled by the control system such that the preheated area or molten pool 5 is supplied with molten wire at a rate providing the intended deposition rate of the Ti-6Al-4V alloy. The control system is simultaneously engaged to operate and regulate the engagement of an actuator (not shown) which constantly positions and moves the holding substrate 1 such that the preheated area or molten pool is located at the intended deposition spot as given by the CAD-model of the object that is to be formed. At this stage of the SFFF-process, the holding substrate 1 is moved as indicated by the lower arrow.

A second example embodiment of the invention is the first example embodiment given above including additional means for forming thermal pulses in the preheated area or molten pool 5. The means for forming thermal pulses is a DC power source 15 which is electrically connected to the second PTA-torch 12 such that the electrode 14 becomes the cathode and the holding substrate 1 becomes the anode. In addition, there are means 16 for pulsing the power delivered by DC power source 15 such that the arc 11 will in addition to heat and melt the wire 3, enter into the preheated area or molten pool 5 with the same frequency as the pulsed power supply and thus deliver a pulsating heat flux to the molten pool. The means 16 may is regulated by the control system and provides a pulsing arc discharge into the preheated area or molten pool with a frequency of 1 kHz.

System Containing a Laser Device and a PAW Torch

In an alternative embodiment of the two welding gun system provided herein, the system can include a laser device as a heating device for a welding gun and a PAW torch, such as a PTA torch, as a heating device for another welding gun. In some configurations, the laser device pre-heats a target deposition area on the base material to form a preheated area, and a PAW torch heats and melts a metal wire, resulting in drops of molten metal that fall into the preheated area of the target deposition area. In some configurations, the PAW torch pre-heats a target deposition area on the base material to form a preheated area, and a laser device heats and melts a metal wire, resulting in drops of molten metal that fall into the preheated area of the target deposition area.

In a first configuration, a laser device can be arranged to direct laser energy to a target area of the base material to form a preheated area, and a PAW torch can be arranged to direct a plasma transferred arc onto an end of a metal wire positioned above the preheated area of the base material. The thermal energy of the PAW torch melts the end of the metal wire, forming droplets of molten metal of the metal wire that drop onto the preheated area of the base material beneath the end of the metal wire. The laser device can promote fusion between the base material and the molten metal material being deposited thereon by deepening the melt-in of the droplets of molten metal into the base material. The arc of the PAW torch also can contribute thermal energy in the vicinity of the preheated area of the target deposition area, contributing to the thermal energy provided by the laser beam. For example, the PAW torch can be connected to the same DC power as the base material thus becoming a cathode while the base material becomes the anode and thus delivering pulsating heat flux to the base material. The superheat from the droplets of molten metal can help maintain a melt pool in the vicinity of the preheated area of the base material. The system can include a metal wire feeding device to provide the metal wire. The metal wire feeding device can be positioned between the laser and the PAW torch, or can be positioned so that it is in closer proximity to the PAW torch than the laser.

The system also can include a positioning device that can position the metal wire above the preheated area in the base material formed by the laser. The positioning device also can properly place the end of the metal wire into the plasma transferred arc so that it melts properly and that the droplets formed by its melting drop onto the preheated area of the base material beneath it.

The metal wire can be or contain Al, Cr, Cu, Fe, Hf, Sn, Mn, Mo, Ni, Nb, Si, Ta, Ti, V, W, or Zr, or composites or alloys thereof. In some embodiments, the metal wire contains Ti or a Ti alloy. The metal wire can be or contain a titanium alloy containing Ti in combination with one or a combination of Al, V, Sn, Zr, Mo, Nb, Cr, W, Si, and Mn. For example, exemplary titanium alloys include Ti-6Al-4V, Ti-6Al-6V-2Sn, Ti-6Al-2Sn-4Zr-6Mo, Ti-45Al-2Nb-2Cr, Ti-47Al-2Nb-2Cr, Ti-47Al-2 W-0.5Si, Ti-47Al-2Nb-1Mn-0.5 W-0.5Mo-0.2Si, and Ti-48Al-2Nb-0.7Cr-0.3Si. The metal wire can contain aluminum, iron, cobalt, copper, nickel, carbon, titanium, tantalum, tungsten, niobium, gold, silver, palladium, platinum, zirconium, alloys thereof, and combinations thereof. When the metal wire is in the form of a wire, the wire can have a cross section of any desired shape. A typical cross section is a circular cross section. The diameter of the wire can be up to about 10 mm, and can be in the range of from about 0.8 mm to about 5 mm. The metal wire can have any practically implementable cross-sectional dimension, e.g., 1.0 mm, 1.6 mm, 2.4 mm, etc. The feed rate and positioning of the metal wire can be controlled and modulated in accord with the effect of the power supply to the PAW torch in order to ensure that the metal wire is being continuously heated and is melted when it reaches the intended position above the preheated area or molten pool in the base material.

The laser device can generate a laser beam of sufficient energy to transfer thermal energy to the base material to preheat an area of the base material. The preheating of the base material via energy from the laser beam promotes fusion between the base material and the melted metallic material by deepening the melt-in in the base material. In some embodiments, at least a portion of the base material can be melted by the energy from the laser beam of the laser device. In some embodiments, sufficient heat is applied by the laser beam of the laser device to form a preheated area or a molten pool in the base material at the position at which the metallic material is to be deposited. Examples of suitable laser devices include a ytterbium (Yb) laser, a Yb fiber laser, a Yb fiber coupled diode laser, a Yb:glass laser, a diode-pumped Yb:YAG laser, a neodymium-doped yttrium aluminum garnet (Nd:YAG) laser, a $CO_2$ laser, a CO laser, a Nd:glass laser, a neodymium-doped yttrium orthovanadate (Nd:YVO) laser, a Cr:ruby laser, a diode laser, a diode pumped laser, an excimer laser, a gas laser, a semiconductor laser, a solid-state laser, a dye laser, an X-ray laser, a free-electron laser, an ion laser, a gas mixture laser, a chemical laser, and combinations thereof. Preferred lasers include Yb lasers, particularly Yb fiber lasers. In many applications, the wavelength used in a Yb fiber laser can be less reflective compared to other laser wavelengths.

The PAW torch can be of any configuration capable of creating an electric arc to heat and melt the metal wire, such as a PTA torch, a gas metal arc welding (GMAW), particularly using non-reactive gases to make the arc (metal inert gas welding or MIG-welding). The metal wire is made to melt in the plasma produced by torch using an electric arc, and the melting metal wire is deposited onto the preheated area or molten pool on the workpiece to add to and form the near net shape metal bodies.

Titanium metal or titanium alloys heated above 400° C. may be subject to oxidation upon contact with oxygen. It is thus necessary to protect the weld and the heated object that is being formed by layered manufacture against oxygen in the ambient atmosphere. One solution to this problem is to enclose the deposition system within a chamber that is closed to the ambient atmosphere and can be made sufficiently void of oxygen. An exemplary chamber is described in international patent application publication WO 2011/019287 (Guldberg). Welding purge chambers for welding under inert gas also are commercially available (e.g., LC Technology Solutions, Inc., Salisbury, Mass.), and easily can be designed or engineered to accommodate a system of any size or configuration. By using a deposition chamber that is sufficiently void of oxygen, such as replacing the ambient gases with argon or other inert gas, speed of the welding process can be increased since the welded zone can be allowed to achieve a higher temperature without risking excessive oxidation of the weld. For example, in production of objects of titanium or titanium alloy, there is no longer need for cooling the welded zone to below 400° C. to avoid oxidation.

In alternative configurations, in which deposition chamber devoid of oxygen is not used, the two gun system can use a shielding gas instead of a chamber to avoid oxidation. In such systems, a nozzle directs a shielding gas, such as Ar, to the area surrounding the metal wire and the PTA torch. For example, an inert gas can be directed through a nozzle, which is provided around the electrode of the welding torch. The nozzle can direct the inert gas around the vicinity of the molten weld pool. The gas shields the preheated area or molten pool from the atmosphere to prevent oxidation. Exemplary systems are described in Ireland et al. (U.S. Pat. No. 7,220,935); Comon et al. (U.S. Pat. No. 9,145,832); and Cooper et al. (U.S. Pat. App. Pub. No. US 2010/0276396).

Figure 9:
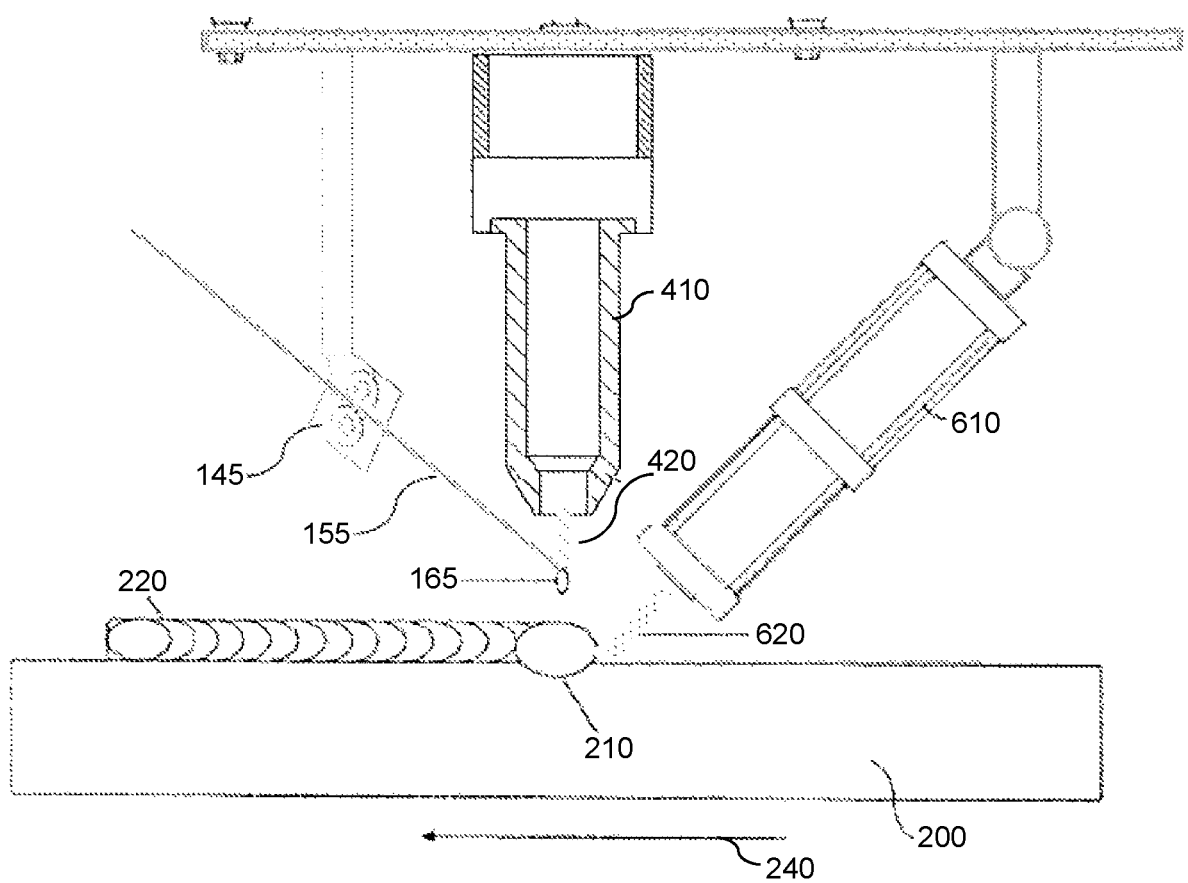
FIG. 9 is a schematic side view of an embodiment of the two gun system provided herein that includes an electron beam device for pre-heating the target deposition area on the base material, and a laser device for heating and melting a metal wire onto the target deposition area on the base material.

An exemplary embodiment of a configuration where a laser device pre-heats a target deposition area on the base material to form a preheated area, and a PTA torch heats and melts a metal wire, is shown in FIG. 9. In the embodiment shown, a base material 200 shaped as a rectangular cuboid is being produced by SFFF. The figure illustrates the initial part of the deposition process where the first welding stripe 220 is being deposited. The two gun system illustrated in FIG. 9 includes a laser device 410 positioned such that the laser beam 420 that it produces is directed to a target area to preheat the base material 200 at the target area, and a PTA torch 110 positioned above the target area melts the metal wire, forming drops of molten metal to fall into preheated area 210.

A metal wire 150 made of the material from which the workpiece is to be formed by SFFF is continuously supplied to the plasma transfer arc 130 produced by the PTA torch 110. The metal wire 150 is supplied by metal wire feeder 140 and is positioned such that the end of the metal wire 150 is located above the preheated area or molten pool 210 at the deposition area on the base material 200. The metal wire 150 can be given a velocity (as indicated by arrow 170) toward the plasma transfer arc 130. The velocity of the metal wire 150 can be selected so that the heating and melting rate of the distal end of the metal wire 150 is such that molten metal droplets 160 of melted metal wire 150 are continuously being supplied to the preheated area or molten pool 210. The metal wire 150 can be fed at any angle into the plasma transfer arc 130 produced by the PTA torch 110, and is not constrained to the angle depicted in FIG. 9.

The plasma transferred arc 130 is formed by a PTA torch 110. As shown, PTA torch 110 is electrically connected to a power source 310 such that the torch electrode 120 becomes the cathode and the metal wire 150 becomes the anode. The power source can be an AC power source or a DC power source. The plasma transferred arc 130 is continuous and directed to heat and melt the distal end of the metal wire 150. The effect of the DC power source 310 is regulated to maintain a heating and melting rate in accordance with the feeding velocity of the metal wire 150 such that the formation of the molten metal droplets 160 are timed to maintain a continuous drip of melted metal wire 150 into the preheated area or molten pool 210. The effect supplied by the DC power source 310 and the feeding velocity of the metal wire 150 exiting the metal wire feeder 140 are constantly regulated and controlled by a control system such that the preheated area or molten pool 210 is supplied with melted metal wire 150 at a rate providing the intended deposition rate of the metal or metal alloy onto base material 200. The control system can be simultaneously engaged to operate and regulate the engagement of an actuator (not shown) that constantly positions and moves the base material 200 such that the preheated area or molten pool 210 is located at the intended deposition spot as given by the CAD model of the object that is to be formed. At this stage of the SFFF-process, the base material 200 is moved as indicated by arrow 240.

FIG. 9 also depicts an optional electrical configuration that can produce thermal pulses in the preheated area or molten pool 210. In the embodiment depicted, a DC power source 320 is electrically connected to the PTA torch 110 such that the torch electrode 120 becomes the cathode and the base material 200 becomes the anode. In addition, a pulsing frequency generator 330 for pulsing the power delivered by DC power source 330 is positioned in the circuit such that the plasma transfer arc 130 will, in addition to heating and melting the metal wire 150, enter into the preheated area or molten pool 210 with the same frequency as the pulsed power supply and thus deliver a pulsating heat flux to the preheated area or molten pool 210. The pulsing frequency generator 330 can be regulated by the control system. In some embodiments, the optional electrical configuration provides a pulsing arc discharge into the preheated area or molten pool 210 with a frequency of 1 to about 200 Hz, although a frequency of up to about 1 kHz can be used. Both power sources 310 and 320 can be pulsed, or only one of power sources 310 or 320 can be pulsed. For example, the wire melting current can be pulsed, or the current to the workpiece can be pulsed, or the wire melting current and the current to the workpiece can be pulsed. When both power sources 310 and 320 are pulsed, the pulse frequency can be the same or different. The pulse frequency can be separately selected up to a frequency of 1 kHz. The pulse frequency can be separately selected in a range of about 1 to 200 Hz, or a range of about 1 to 100 Hz, or a range of about 10 to 100 Hz, or a range of about 5 to 50 Hz.

The use of a laser device to preheat the base material and form a preheated area, and a PTA torch to melt the feed wire of metallic material provides the advantage that it becomes possible to increase the heat supply to the feed of the metallic wire independently of the heat supply to the substrate such that it becomes possible to increase the heat flux into the feed material with no risk of creating a "spray arc" which generates spatter. The melting power applied to the metal wire can be selected to match the mass input (the amount of molten metal droplets of metal wire to be added to the workpiece) in order to secure a stable melting of the metal wire and/or burn-off point. The laser device can allow for directed placement of thermal energy to a targeted area. Thus, it is possible to increase the deposition rate of the molten metallic feed material without simultaneously overheating the substrate and without risk of spatter or forming an excessive preheated area or molten pool and thus, losing control of the consolidation of the deposited material.

The laser device also can be configured so that the laser beam can be scanned along the X or Y direction to cover a wider area than just a focused point of a laser beam. The scan spacing can be from about 0.001 to about 0.1 inch. The melting characteristics of the target area heated by the laser device can be modified by adjusting the laser beam. For example, the power of the laser beam can be adjusted, or the laser beam device can be configured so that the laser beam can be moved relative to the surface of the workpiece, or the approach direction and angle of the laser beam can be adjusted, or any combination of these can be modified to adjust the pre-heating of the target area. Any loss of efficiency due to reflection of the laser beam by the surface of the workpiece also can be compensated for by adjusting the approach direction and angle of the laser beam.

By moving the laser beam relative to the surface of the workpiece along a predetermined path, the area heated by the laser beam layer can be defined in two dimensions on the substrate, the width of the layer being determined by the diameter of the laser beam where it strikes the substrate. The movement of the laser beam along a predetermined path can be under computer control. Modulating the pulse shape and/or duration provides a way to control the specific power of laser light provided during the movement of the laser beam. The laser beam also can be delivered in pulses. Conventional focusing optics also can be used to adjust the focus of the laser beam on the surface of the workpiece.

The laser device 410 can be mounted so as to be moveable under the control of a computer in the X-Y plane parallel to the base material surface, and vertically in the Z direction orthogonal to it. The laser beam 420 thus can be directed to any point in the X-Y plane, and vertically so as to accommodate workpieces of different height, and regions of different height within workpieces. As illustrated in FIG. 9, the traverse direction is in the direction of arrow 240, the apparatus being in the process of fabricating the layer 220. When using a laser devise as the welding gun to form a preheated area or molten pool, mirrors can also be used to direct the laser to define the area on the base material to preheat or melt.

In a different configuration, a PAW torch can be arranged to direct a plasma transferred arc to a target area of the base material to form a preheated area, and a laser device can be positioned to direct a laser beam onto an end of a metal wire positioned above the preheated area of the base material. The thermal energy of the laser beam melts the end of the metal wire, forming droplets of molten metal of the metal wire that drop onto the preheated area of the base material beneath the end of the metal wire. The PAW torch pre-heats a target area and can promote fusion between the base material and the molten metal material by deepening the melt-in of the droplets of molten metal into the base material. The laser beam of the laser device can also be used to contribute thermal energy in the preheated area or molten pool in the base material at the target deposition area, contributing to the thermal energy provided by the PAW torch. The superheat from the droplets of molten metal can help maintain a melt pool in the vicinity of the preheated area of the base material. The system can include a metal wire feeding device to provide the metal wire to the desired location beneath the laser beam. The metal wire feeding device can be positioned between the laser and the PAW torch, or can be positioned so that it is in closer proximity to the laser device than the PAW torch.

The system also can include a positioning device that can position the metal wire above the preheated area in the base material formed by the PAW torch. The positioning device also can properly place the end of the metal wire into the laser beam so that the metal wire melts properly and that the droplets of molten metal formed by the melting wire drop onto the preheated area of the base material beneath it.

The metal wire can be or contain Al, Cr, Cu, Fe, Hf, Sn, Mn, Mo, Ni, Nb, Si, Ta, Ti, V, W, or Zr, or composites or alloys thereof. In some embodiments, the metal wire contains Ti or a Ti alloy. The metal wire can be or contain a titanium alloy containing Ti in combination with one or a combination of Al, V, Sn, Zr, Mo, Nb, Cr, W, Si, and Mn. For example, exemplary titanium alloys include Ti-6Al-4V, Ti-6Al-6V-2Sn, Ti-6Al-2Sn-4Zr-6Mo, Ti-45Al-2Nb-2Cr, Ti-47Al-2Nb-2Cr, Ti-47Al-2 W-0.5Si, Ti-47Al-2Nb-1Mn-0.5 W-0.5Mo-0.2Si, and Ti-48Al-2Nb-0.7Cr-0.3Si. The metal wire can contain aluminum, iron, cobalt, copper, nickel, carbon, titanium, tantalum, tungsten, niobium, gold, silver, palladium, platinum, zirconium, alloys thereof, and combinations thereof. Metal wire can be of any configuration and have a cross section of any desired shape. The wire can have a circular cross section. The diameter of the wire can be in the range of from about 0.8 mm to about 5 mm. The metal wire can have any practically implementable cross-sectional dimension, e.g., 1.0 mm, 1.6 mm, 2.4 mm, etc. The feed rate and positioning of the metal wire can be computer controlled, in order to ensure that the metal wire is melted when it reaches the intended position above the preheated area or molten pool in the base material.

The laser device can generate a laser beam of sufficient energy to transfer thermal energy to the metal wire to melt the wire to form molten drops of metal. Examples of suitable laser devices include a ytterbium (Yb) laser, a Yb fiber laser, a Yb fiber coupled diode laser, a Yb:glass laser, a diode-pumped Yb:YAG laser, a neodymium-doped yttrium aluminum garnet (Nd:YAG) laser, a $CO_2$ laser, a CO laser, a Nd:glass laser, a neodymium-doped yttrium orthovanadate (Nd:YVO) laser, a Cr:ruby laser, a diode laser, a diode pumped laser, an excimer laser, a gas laser, a semiconductor laser, a solid-state laser, a dye laser, an X-ray laser, a free-electron laser, an ion laser, a gas mixture laser, a chemical laser, and combinations thereof. Preferred lasers include Yb lasers, particularly Yb fiber lasers. In many applications, the wavelength used in a Yb fiber laser can be less reflective compared to other laser wavelengths.

The PAW torch used to pre-heat the target area of the workpiece can be of any configuration capable of creating an electric arc to heat at least a portion of the surface of the workpiece, and make it receptive to the drops of molten metal from the melted metal wire. An exemplary PAW torch can include a PTA torch or those used for gas metal arc welding (GMAW), particularly using non-reactive gases to make the arc (metal inert gas welding or MIG-welding). The target area of the workpiece is preheated by the plasma produced by torch using an electric arc. The melting metal wire is deposited as molten drops of metal onto the preheated area or molten pool on the workpiece to add to and form the near net-shape workpiece.

When using a PAW torch such as a PTA torch the arc of the plasma transferred arc may be controlled to define the area to preheat or melt. The arc may be adjusted using a magnetic field. Also, the area to be preheated or melted in the base material may also be defined by moving the PAW torch using mechanic and/or hydraulic actuators or any actuator as described herein.

As discussed above, titanium metal or titanium alloys heated above 400° C. may be subject to oxidation upon contact with oxygen. To protect the weld and the heated object that is being formed by layered manufacture against oxygen in the ambient atmosphere, a chamber that is closed to the ambient atmosphere and that can be made sufficiently void of oxygen can be used. An exemplary chamber is described in international patent application publication WO 2011/019287 (Guldberg). Welding purge chambers for welding under inert gas also are commercially available (e.g., LC Technology Solutions, Inc., Salisbury, Mass.), and easily can be designed or engineered to accommodate a system of any size or configuration. By using a deposition chamber that is sufficiently void of oxygen, such as replacing the ambient gases with argon or other inert gas, speed of the welding process can be increased since the welded zone can be allowed to achieve a higher temperature without risking excessive oxidation of the weld.

Alternatively, the two gun system can use a shielding gas instead of a chamber to avoid oxidation. In such systems, a nozzle directs a shielding gas, such as Ar, to the area surrounding the target area and the PTA torch. For example, an inert gas can be directed through a nozzle, which is provided around the electrode of the welding torch. The nozzle can direct the inert gas around the vicinity of the target area and the molten weld pool. The gas shields the preheated area or molten pool from the atmosphere to prevent oxidation. Exemplary systems are described in Ireland et al. (U.S. Pat. No. 7,220,935); Comon et al. (U.S. Pat. No. 9,145,832); and Cooper et al. (U.S. Pat. App. Pub. No. US 2010/0276396).

Figure 10:
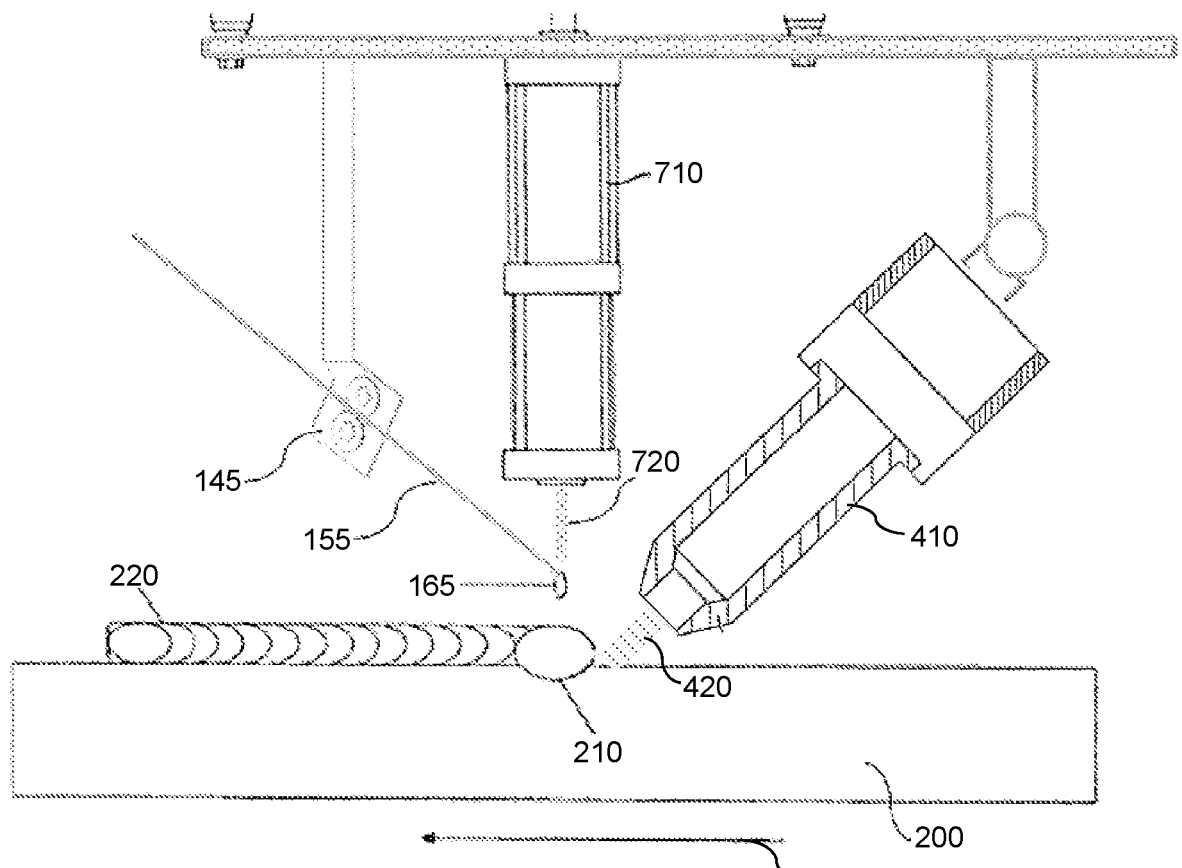
FIG. 10 is a schematic side view of an embodiment of the two gun system provided herein that includes laser device for pre-heating the target deposition area on the base material, and an electron beam device for heating and melting a metal wire onto the target deposition area on the base material.

An exemplary embodiment of a configuration where a PTA torch pre-heats a target deposition area on the base material to form a preheated area, and a laser beam from a laser device heats and melts a metal wire, is shown in FIG. 10. In the embodiment shown, a base material 200 shaped as a rectangular cuboid is being produced by SFFF. The figure illustrates the initial part of the deposition process where the first welding stripe 220 is being deposited. The two gun system illustrated in FIG. 10 includes a PTA torch 110 positioned such that the plasma transfer arc 130 that it produces is directed to a target area to preheat the base material 200 at the target area, and a laser device 410 positioned above the target area melts a metal wire, forming drops of molten metal to fall onto preheated area or molten pool 210.

A metal wire 155 made of the material from which the workpiece is to be formed by SFFF is continuously supplied to the laser beam 420 produced by the laser device 410. The metal wire 155 is supplied by metal wire feeder 145 and is positioned such that the end of the metal wire 155 is located above the preheated area or molten pool 210 at the deposition area on the base material 200. The metal wire 155 can be given a velocity (as indicated by arrow 170) toward the laser beam 420. The velocity of the metal wire 155 can be selected so that the heating and melting rate of the distal end of the metal wire 155 is such that molten metal droplets 165 of melted metal wire 155 are continuously being supplied to the preheated area or molten pool 210.

The laser beam 420 of laser device 410 is directed to the distal end of metal wire 155 to melt the metal wire and form molten metal droplets 165. The amount of thermal energy provided by the laser beam 420 can be regulated to maintain a heating and melting rate in accordance with the feeding velocity of the metal wire 155 such that the formation of the molten metal droplets 165 are timed to maintain a continuous drip of melted metal wire 155 onto the preheated area or molten pool 210. The laser beam 420 and the feeding velocity of the metal wire 155 exiting the metal wire feeder 145 can be constantly regulated and controlled by a control system, e.g., computer, such that the preheated area or molten pool 210 is supplied with melted metal wire 155 at a rate providing the intended deposition rate of the metal or metal alloy onto base material 200. The metal wire can be fed at any angle into the laser beam, and is not constrained to the angle depicted in FIG. 10. The control system can be simultaneously engaged to operate and regulate the engagement of an actuator (not shown) that constantly positions and moves the base material 200 such that the preheated area or molten pool 210 is located at the intended deposition spot as given by the CAD model of the object that is to be formed.

In exemplary embodiments, as discussed earlier, the laser beam can also be manipulated so as to be directed not only to the metal wire 155 but also to an area in the base material located under the dripping melted metal wire. In this manner the laser beam can be employed to further heat to the already preheated area or molten pool created by the PTA torch 110.

The plasma transferred arc 130 is formed by a PTA torch 110. As shown, PTA torch 110 can be electrically connected to a power source 320 such that the torch electrode 120 becomes the cathode and the workpiece 200 becomes the anode. The power source can be an AC power source or a DC power source. The plasma transferred arc 130 can be continuous and directed to heat at least a portion of a target area on the surface of the workpiece. The pre-heating of the target surface can make it more receptive to the molten metal droplets 165 from the melted metal wire 155. The pre-heating of the target surface can melt a portion of the workpiece surface at the target area. The effect of the DC power source 310 can be regulated to maintain a heating and/or melting rate in accordance with a targeted velocity of the metal wire 155 such that the target area is preheated and receptive to the molten metal droplets 165. The effect supplied by the DC power source 310 and the feeding velocity of the metal wire 155 exiting the metal wire feeder 145 can be constantly regulated and controlled by a control system such that the preheated area or molten pool 210 is supplied with melted metal wire 150 at a rate providing the intended deposition rate of the metal or metal alloy onto base material 200. At this stage of the SFFF-process, the base material 200 is moved as indicated by arrow 240.

FIG. 10 also depicts an optional electrical configuration that can produce thermal pulses in the preheated area or molten pool 210. In the embodiment depicted, a DC power source 320 can be electrically connected to the PTA torch 110 such that the torch electrode 120 becomes the cathode and the base material 200 becomes the anode. In addition, a pulsing frequency generator 330 for pulsing the power delivered by DC power source 330 is positioned in the circuit such that the plasma transfer arc 130 will, in addition to heating and optionally melting a portion of the target area on the surface of the workpiece, delivers a pulsating heat flux to the target area. The pulsing frequency generator 330 can be regulated by a control system. In some embodiments, the optional electrical configuration provides a pulsing arc discharge with a frequency of 1 to about 200 Hz, although a frequency of up to about 1 kHz can be used. In some applications, the pulse frequency can be in a range of about 1 to 100 Hz, or a range of about 10 to 100 Hz, or a range of about 5 to 50 Hz.

The use of a PTA torch to preheat the base material and form a preheated area, and a laser beam to melt the feed wire of metallic material provides the advantage that it becomes possible to increase the heat supply to the feed of the metallic wire independently of the heat supply to the substrate. The melting power applied to the metal wire can be selected to match the mass input (the amount of molten metal droplets of metal wire to be added to the workpiece) in order to secure a stable melting of the metal wire and/or burn-off point. Thus, it is possible to increase the deposition rate of the molten metallic feed material without simultaneously over-heating the substrate and without risk of spatter or forming an excessive preheated area or molten pool and thus, losing control of the consolidation of the deposited material.

System Containing Two Laser Devices

In some configurations of the two welding gun system provided herein, the system can include two laser devices as heating devices used for the two welding guns. In one configuration, a laser device pre-heats a target deposition area on the base material, and another laser system heats and melts a metal wire, forming droplets that drip onto a preheated area or molten pool on the target deposition layer. In another configuration, a laser device pre-heats the target deposition area on the base material, and a laser blown powder welding gun system heats and melts a powdered metal onto a preheated area or molten pool on the target deposition layer.

In one configuration, a first laser device can be arranged to direct a first laser beam to a target area of the base material to form a preheated area, and a second laser device can be positioned to direct a second laser beam onto an end of a metal wire positioned above a preheated area of the base material. The thermal energy of the laser beam of a second laser device melts the end of the metal wire, forming droplets of molten metal of the metal wire that drop onto the preheated area of the base material beneath the end of the metal wire. As discussed in conjunction with other embodiments, the laser beam of the second laser device used to melt the metal wire can also be used to contribute thermal energy in the preheated area or molten pool in the base material at the target deposition area, contributing to the thermal energy provided by the laser beam of the first laser device. The laser beam of the first laser device pre-heats a target area and can promote fusion between the base material and the molten metal material by deepening the melt-in of the droplets of molten metal into the base material. The superheat from the droplets of molten metal can help maintain a melt pool in the vicinity of the preheated area of the base material. The system can include a metal wire feeding device to provide the metal wire to the desired location beneath the laser beam of the second laser device. The metal wire feeding device can be positioned between the first laser device and the second laser device, or can be positioned so that it is in closer proximity to the second laser device than the first laser device.

The system also can include a positioning device that can position the metal wire above the preheated area in the base material formed by the first laser device. The positioning device also can properly place the end of the metal wire into the laser beam of the second laser device so that the metal wire melts properly and that the droplets of molten metal formed by the melting wire drop onto the preheated area of the base material beneath it.

The metal wire can be or contain Al, Cr, Cu, Fe, Hf, Sn, Mn, Mo, Ni, Nb, Si, Ta, Ti, V, W, or Zr, or composites or alloys thereof. In some embodiments, the metal wire contains Ti or a Ti alloy. The metal wire can be or contain a titanium alloy containing Ti in combination with one or a combination of Al, V, Sn, Zr, Mo, Nb, Cr, W, Si, and Mn. For example, exemplary titanium alloys include Ti-6Al-4V, Ti-6Al-6V-2Sn, Ti-6Al-2Sn-4Zr-6Mo, Ti-45Al-2Nb-2Cr, Ti-47Al-2Nb-2Cr, Ti-47Al-2 W-0.5Si, Ti-47Al-2Nb-1Mn-0.5 W-0.5Mo-0.2Si, and Ti-48Al-2Nb-0.7Cr-0.3Si. The metal wire can contain aluminum, iron, cobalt, copper, nickel, carbon, titanium, tantalum, tungsten, niobium, gold, silver, palladium, platinum, zirconium, alloys thereof, and combinations thereof. Metal wire can be of any configuration. The wire can have a circular cross section. The diameter of the wire can be in the range of from about 0.8 mm to about 5 mm. The metal wire can have any practically implementable cross-sectional dimension, e.g., 1.0 mm, 1.6 mm, 2.4 mm, etc. The feed rate and positioning of the metal wire can be computer controlled, in order to ensure that the metal wire is melted when it reaches the intended position above the preheated area or molten pool in the base material.

The first laser device can generate a laser beam of sufficient energy to transfer thermal energy to the target area of the workpiece to heat, and optionally melt at least a portion of the surface, so that the target area is receptive to the molten metal droplets of metal from the melted metal wire. The second laser device can generate a laser beam of sufficient energy to transfer thermal energy to the metal wire to melt the wire to form molten drops of metal. Examples of suitable laser devices include a ytterbium (Yb) laser, a Yb fiber laser, a Yb fiber coupled diode laser, a Yb:glass laser, a diode-pumped Yb:YAG laser, a neodymium-doped yttrium aluminum garnet (Nd:YAG) laser, a $CO_2$ laser, a CO laser, a Nd:glass laser, a neodymium-doped yttrium orthovanadate (Nd:YVO) laser, a Cr:ruby laser, a diode laser, a diode pumped laser, an excimer laser, a gas laser, a semiconductor laser, a solid-state laser, a dye laser, an X-ray laser, a free-electron laser, an ion laser, a gas mixture laser, a chemical laser, and combinations thereof. Preferred lasers include Yb lasers, particularly Yb fiber lasers. In many applications, the wavelength used in a Yb fiber laser can be less reflective compared to other laser wavelengths. In some configurations, the first laser device contains a laser of the same material as the second laser device. For example, both laser devices can include a Yb laser. In some configurations, the laser of the first laser device is of different material than the laser of the second laser device.

The first laser device can be configured so that the laser beam it produces can be scanned along the X or Y direction over the surface of the workpiece to cover a wider area than just a focused point of a laser beam. The scan spacing can be from about 0.001 to about 0.1 inch. The melting characteristics of the target area heated by the laser beam of the first laser device can be modified by adjusting the laser device. For example, the power of the laser beam can be adjusted, or the laser beam device can be configured so that the laser beam can be moved relative to the surface of the workpiece, or the approach direction and angle of the laser beam can be adjusted, or any combination of these can be modified to adjust the pre-heating of the target area. Any loss of efficiency due to reflection of the laser by the surface of the workpiece also can be compensated for by adjusting the approach direction and angle of the laser beam.

By moving the laser beam of the first laser device relative to the surface of the workpiece along a predetermined path, the area heated by the laser beam layer can be defined in two dimensions on the substrate, the width of the layer being determined by the diameter of the laser beam where it strikes the substrate. The movement of the laser beam along a predetermined path can be under computer control. Modulating the pulse shape and/or duration provides a way to control the specific power of laser light provided by the first laser device during the movement of the laser beam across the surface of the workpiece. The laser beam of the first laser device also can be delivered in pulses. Conventional focusing optics also can be used to adjust the focus of the laser beam on the surface of the workpiece.

The first laser device can be mounted so as to be moveable under the control of a computer in the X-Y plane parallel to the base material surface, and vertically in the Z direction orthogonal to it. The laser beam of the first laser device thus can be directed to any point in the X-Y plane, and vertically so as to accommodate workpieces of different height, and regions of different height within workpieces.

Figure 11:
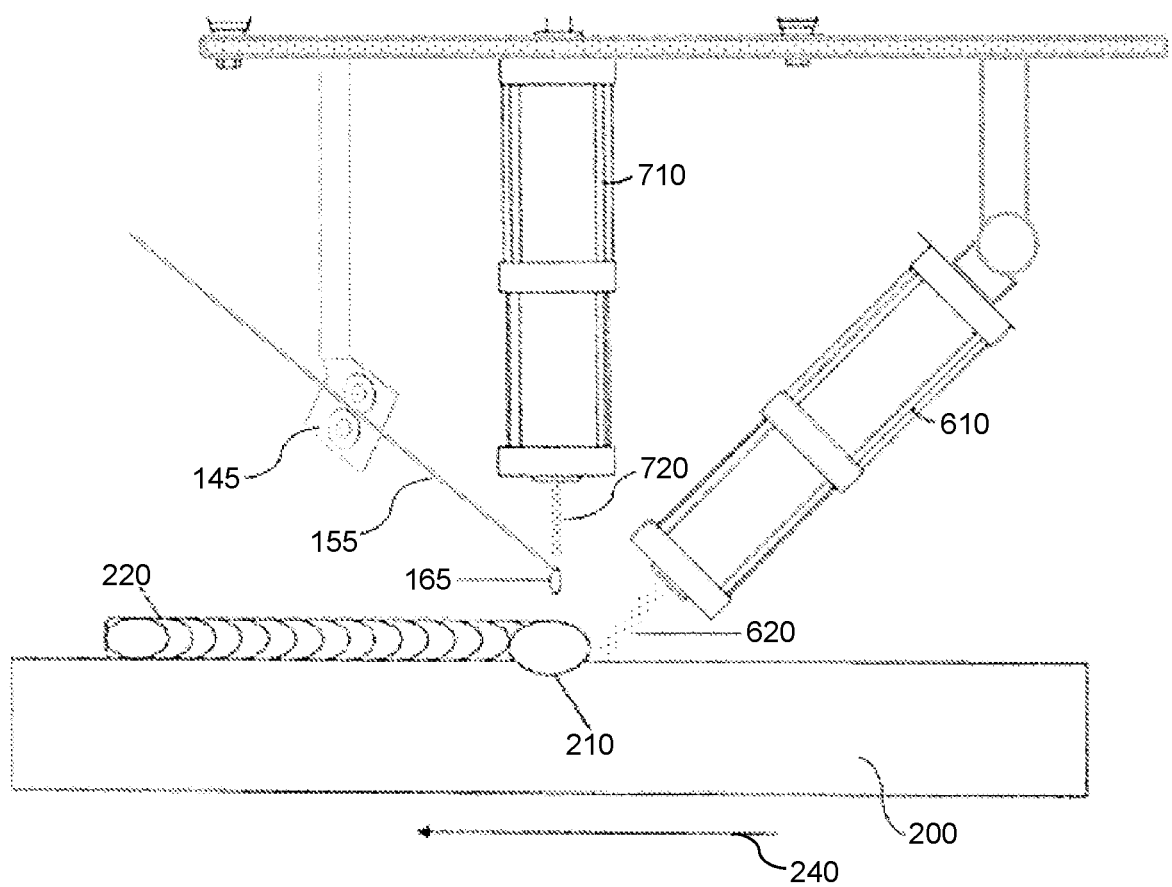
FIG. 11 is a schematic side view of an embodiment of the two gun system provided herein that includes a first electron beam device for pre-heating the target deposition area on the base material, and a second electron beam device for heating and melting a metal wire onto the target deposition area on the base material.

An exemplary embodiment of a configuration where a laser beam from a laser device pre-heats a target deposition area on the base material to form a preheated area, and a laser beam from another laser device heats and melts a metal wire, is shown in FIG. 11. In the embodiment shown, a base material 200 shaped as a rectangular cuboid is being produced by solid freeform fabrication. The figure illustrates the initial part of the deposition process where the first welding stripe 220 is being deposited. The two gun system illustrated in FIG. 11 includes a first laser device 410 positioned such that the laser beam 420 that it produces is directed to a target area to preheat the base material 200 at the target area, and a second laser device 430 positioned above the target area melts a metal wire 155, forming molten metal droplets 165 that fall onto the preheated area or molten pool 210.

A metal wire 155 made of the material from which the workpiece is to be formed by freeform fabrication is continuously supplied to the laser beam 435 produced by the second laser device 430. The metal wire 155 is supplied by metal wire feeder 145 and is positioned such that the end of the metal wire 155 is located above the preheated area or molten pool 210 at the deposition area on the base material 200. The metal wire 155 is given a velocity (as indicated arrow 170) toward the laser beam 435. The velocity of the metal wire 155 can be selected so that the heating and melting rate of the distal end of the metal wire 155 is such that molten metal droplets 165 of melted metal wire 155 are continuously being supplied to the preheated area or molten pool 210.

The laser beam 435 of second laser device 430 is directed to the distal end of metal wire 155 to melt the metal wire and form molten metal droplets 165. The amount of thermal energy provided by the laser beam 435 of the second laser device 430 can be regulated to maintain a heating and melting rate in accordance with the feeding velocity of the metal wire 155 such that the formation of the molten metal droplets 165 are timed to maintain a continuous drip of melted metal wire 155 into the preheated area or molten pool 210. The laser beam 420 and the feeding velocity of the metal wire 155 exiting the metal wire feeder 145 can be constantly regulated and controlled by a control system, e.g., computer, such that the preheated area or molten pool 210 is supplied with melted metal wire 155 at a rate providing the intended deposition rate of the metal or metal alloy onto base material 200. The metal wire can be fed at any angle into the laser beam, and is not constrained to the angle depicted in FIG. 11. The control system can be simultaneously engaged to operate and regulate the engagement of an actuator (not shown) that constantly positions and moves the base material 200 such that the preheated area or molten pool 210 is located at the intended deposition spot as given by the CAD model of the object that is to be formed.

The first laser device 410 can be mounted so as to be moveable under the control of a computer in the X-Y plane parallel to the base material surface, and vertically in the Z direction orthogonal to it. The laser beam 420 of first laser device 410 thus can be directed to any point in the X-Y plane on the surface of the workpiece, and vertically so as to accommodate workpieces of different height, and regions of different height within workpieces. As illustrated in FIG. 11, the traverse direction is in the direction of arrow 240, the apparatus being in the process of fabricating the layer 220.

In a different configuration, a laser device is used as the first welding gun, and a laser blown powder system is used as the second welding gun. The laser device can be arranged to direct a laser beam to a target area of the base material to form a preheated area, and a laser blown powder system heats and melts a powdered metal onto a preheated area or molten pool on the target deposition layer. The laser beam of the laser device pre-heats a target area and can promote fusion between the base material and the molten metal material by deepening the melt-in of the droplets of molten metal into the base material. The thermal energy of the laser of the laser blown powder system melts metal particles, forming droplets of molten metal that drop onto the preheated area of the base material beneath the laser blown powder system. The laser blown powder system can also be used to contribute thermal energy in the preheated area or molten pool in the base material at the target deposition area, contributing to the thermal energy provided by the laser beam of the laser device. The superheat from the droplets of molten metal can help maintain a melt pool in the vicinity of the preheated area of the base material.

In the laser blown powder system, metal powder is blown into the interaction zone between a laser beam and the workpiece. The powder generally is carried into the laser path by a carrier gas. In some embodiments, a coaxial powder feed nozzle is used. Examples of coaxial powder feed nozzles that can be used or modified for use in the system are described in U.S. Pat. No. 6,774,338 (Baker et al.); U.S. Pat. No. 6,608,281 (Ishide et al); U.S. Pat. No. 5,486,676 (Aleshin); and U.S. Pat. App. Pub. Nos. US2015/0328718 (Iwatani et al.); US2005/0056628 (Hu); and US2006/0065650 (Guo).

The coaxial feed nozzle feeds a metal powder stream into the nozzle so that it is directed to a focal point of the laser, heating the powder to a near-melting temperature or to a temperature that melts the powder particles into droplets of metal, which are deposited onto the preheated area or molten pool on the workpiece. The laser of the laser device forming the preheated area or molten pool can be pulsed during the cooling process to modify the microstructure of the added layer thereby relieving any stress imparted by the additive layering process.

Figure 8:
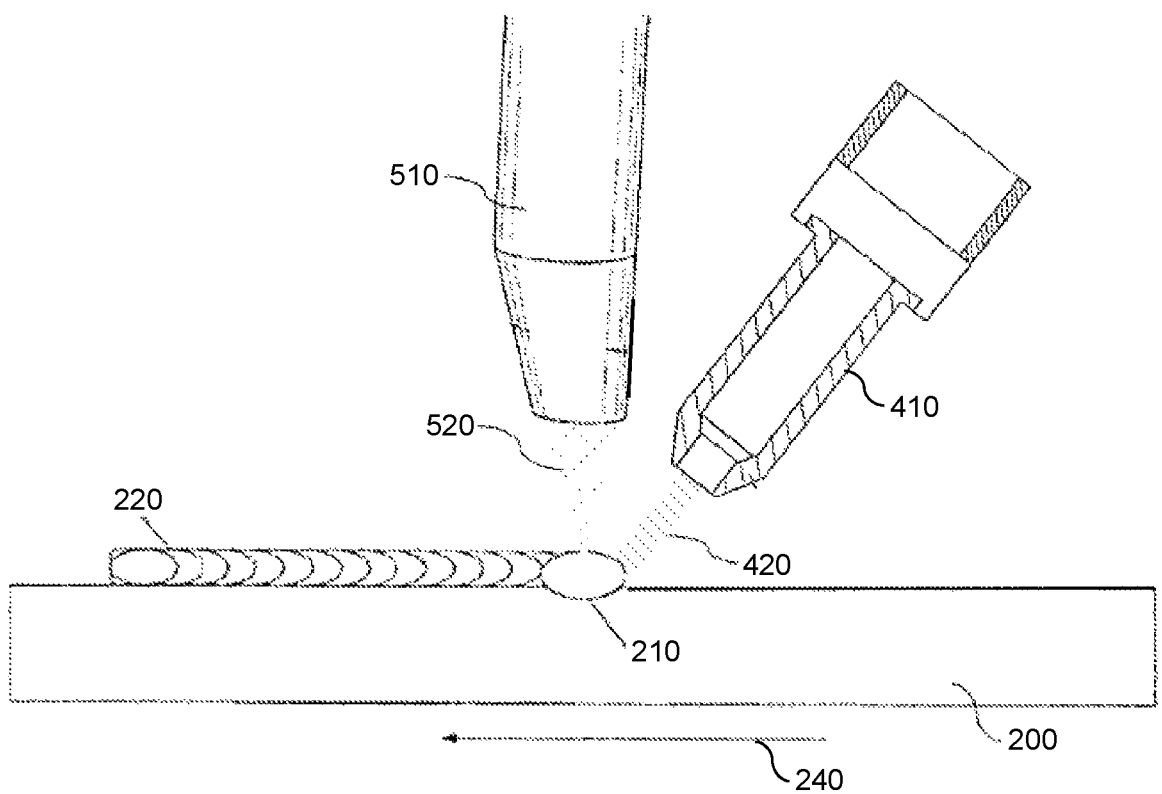
FIG. 8 is a schematic side view of an embodiment of the two gun system provided herein that includes a laser device for pre-heating the target deposition area on the base material, and a laser blown powder system for heating and melting metal onto the target deposition area on the base material.

An exemplary embodiment is shown in FIG. 8. In the embodiment shown, a base material 200 shaped as a rectangular cuboid is being produced by solid freeform fabrication. The figure illustrates the initial part of the deposition process where the first welding stripe 220 is being deposited. The two gun system illustrated in FIG. 8 includes a laser device 410 positioned such that the laser beam 420 that it produces is directed to a target area to pre-heat a portion of the surface of the base material 200 at the target area, and a coaxial powder feed nozzle laser system 510 positioned above the preheated target area, forming molten metal particles 520 that drop onto preheated area or molten pool 210.

A powder delivery system (not shown in the figure) delivers powder metal to the coaxial powder feed nozzle laser system 510. The powder metal is of or contains a combination of metals that when melted forms the material from which the workpiece is to be formed by freeform fabrication. The powdered metal can be titanium, or can be or contain a titanium alloy containing Ti in combination with one or a combination of Al, V, Sn, Zr, Mo, Nb, Cr, W, Si, and Mn. For example, exemplary titanium alloys include Ti-6Al-4V, Ti-6Al-6V-2Sn, Ti-6Al-2Sn-4Zr-6Mo, Ti-45Al-2Nb-2Cr, Ti-47Al-2Nb-2Cr, Ti-47Al-2 W-0.5Si, Ti-47Al-2Nb-1Mn-0.5 W-0.5Mo-0.25i, and Ti-48Al-2Nb-0.7Cr-0.3Si. The powdered metal can contain aluminum, iron, cobalt, copper, nickel, carbon, titanium, tantalum, tungsten, niobium, gold, silver, palladium, platinum, zirconium, alloys thereof, and combinations thereof.

The powder can be continuously delivered to a laser focal point created by the blown powder laser system 510 where it is heated to its melting point or fully melted into droplets of molten metal 520 that are deposited onto the preheated area or molten pool 210 on the base material 200. The velocity of the powder metal provided to the blown powder laser system 510 is selected so that the heating and melting rate is such that heated powder or droplets of molten metal 520 are continuously being supplied to the preheated area or molten pool 210. During cooling, the laser device 410 can be pulsed to modulate the microstructure of the delivered layer of molten metal. The two guns can be fixed on a single frame so at to always maintain the proper distance.

The two gun system that includes two laser systems as heating devices can include a control system that can operate and regulate the engagement of an actuator (not shown) which can constantly position and move the base material 200 such that the preheated area or molten pool is located at the intended deposition spot as given by the CAD-model of the object that is to be formed. At this stage of the SFFF-process, the base material 200 is moved as indicated by arrow 240. The actuator is moveable under the control of the control system in the X-Y plane parallel to two gun system, and vertically in the Z direction orthogonal to it. The laser focal point of the laser device 410 also is movable and can be directed to any point in the X-Y plane on the surface of the workpiece, and vertically so as to accommodate both workpieces of different height and also regions of different height within workpieces. An exemplary laser 410 is a Yb fiber laser.

The two gun system that includes two laser devices as heating devices can be enclosed within a chamber that is closed to the ambient atmosphere and can be made sufficiently void of oxygen. An exemplary chamber is described in international patent application publication WO 2011/019287 (Guldberg). Welding purge chambers for welding under inert gas also are commercially available (e.g., LC Technology Solutions, Inc., Salisbury, Mass.), and easily can be designed or engineered to accommodate a system of any size or configuration. By using a deposition chamber that is sufficiently void of oxygen, such as replacing the ambient gases with argon or other inert gas, speed of the welding process can be increased since the welded zone can be allowed to achieve a higher temperature without risking excessive oxidation of the weld.

Alternatively, the two gun system that includes two laser devices can be configured so that an envelope of a shielding gas surrounds the deposition process area to avoid oxidation. In such systems, a nozzle to direct a shielding gas, such as Ar, to the area surrounding the coaxial powder feed nozzle laser system 510 and the preheated area or molten pool 210. For example, an inert gas can be directed through one or more nozzles positioned on support 530 to direct the inert gas around the vicinity of the molten weld pool. The gas shields the preheated area or molten pool from the atmosphere to prevent oxidation. Systems that can be used or adapted for use with the two gun system are described in Ireland et al. (U.S. Pat. No. 7,220,935); Comon et al. (U.S. Pat. No. 9,145,832); and Cooper et al. (U.S. Pat. App. Pub. No. US 2010/0276396).

The use of a laser device to preheat the base material and form a preheated area, and another laser device to melt a metal wire or metal particles, provides the advantage that it becomes possible to increase the heat supply to the metal wire or metal particles independently of the heat supplied to the substrate. The melting power applied to the metal wire or metal particles can be selected to match the mass input (the amount of molten metal droplets to be added to the workpiece) in order to secure a stable melting of the metal wire and/or burn-off point or to ensure complete melting of the metal particles. Thus, it is possible to increase the deposition rate of the molten metallic feed material without simultaneously over-heating the substrate and without risk of forming an excessive preheated area or molten pool and thus, losing control of the consolidation of the deposited material.

System Containing a Laser Device and an Electron Beam Device

In some configurations of the two welding gun system provided herein, the system can include a laser device as one welding gun and an electron beam device as the other welding gun. In some configurations, the electron beam device pre-heats a target deposition area on the base material to form a preheated area, and a laser device heats and melts a metal wire, resulting in drops of molten metal that fall into the preheated area of the target deposition area. In some configurations, a laser device pre-heats a target deposition area on the base material to form a preheated area, and an electron beam device heats and melts a metal wire, resulting in drops of molten metal that fall into the preheated area of the target deposition area.

In one configuration, an electron beam device is used as the first welding gun and can be arranged to direct an electron beam to a target area of the base material to form a preheated area, and a laser device is used as a second welding gun and can be positioned to direct a laser beam onto an end of a metal wire positioned above the preheated area of the base material. The thermal energy of the laser beam melts the end of the metal wire, forming droplets of molten metal of the metal wire that drop onto the preheated area of the base material beneath the end of the metal wire. The electron beam of the electron beam device pre-heats a target area and can promote fusion between the base material and the molten metal material by deepening the melt-in of the droplets of molten metal into the base material. As discussed in conjunction with other embodiments, the laser beam of the first laser device can also be used to contribute thermal energy in the preheated area or molten pool in the base material at the target deposition area, contributing to the thermal energy provided by the electron beam. The superheat from the droplets of molten metal can help maintain a melt pool in the vicinity of the preheated area of the base material. The system can include a metal wire feeding device to provide the metal wire to the desired location beneath the laser beam. The metal wire feeding device can be positioned between the laser device and the electron beam device, or can be positioned so that it is in closer proximity to the laser device than the electron beam device.

The electron beam device can be arranged to direct an electron beam to a target area of the base material to form a preheated area. The electron beam device can generate an electron beam of sufficient energy to transfer thermal energy to the target area of the workpiece to heat, and optionally melt at least a portion of the surface, so that the target area is receptive to the molten metal droplets of metal from the melted metal wire. Electron beam devices are commercially available and described in the art (e.g., see U.S. Pat. No. 3,136,882 (Radtke, 1964); U.S. Pat. No. 3,187,216 (Sciaky, 1965); U.S. Pat. No. 3,535,489 (Hinrichs (1970); U.S. Pat. No. 3,592,995 (Hinrichs, 1971); U.S. Pat. No. 3,766,355 (Kottkamp, 1973); U.S. Pat. No. 4,058,697 (Sokolov et al., 1977); U.S. Pat. No. 4,327,273 (Kita et al., 1982); U.S. Pat. No. 4,677,273 (Colegrove et al., 1987); U.S. Pat. No. 4,698,546, Maitland et al., 1987); U.S. Pat. No. 6,882,095 (Avnery, 2005); and Taminger and Hafley, *Electron Beam Freeform Fabrication for Cost Effective Near-Net Shape Manufacturing,*" NATO, 2006).

The electron beam device can be configured so that the electron beam it produces can be scanned along the X or Y direction over the surface of the workpiece to cover a wider area than just a focused point of the electron beam. The scan spacing can be from about 0.001 to about 0.1 inch. The melting characteristics of the target area heated by the electron beam can be modified by adjusting the electron beam device. The electron beam device can be selected so that it contains electromagnetic coils to modulate the electron beam. The electron beam device can provide energy in the form of a stream of focused electrons accelerated towards the workpiece. The electrons can be accelerated using a high voltage potential (e.g., greater than about 15 kV, such as in the range of from about 15 kV to about 150 kV). The electrons can be generated within the electron beam device using one or more heated filaments. The power output of the electron beam gun typically can be controlled by limiting or modulating the flow of electrons to the workpiece. For example, a beam power of up to about 30 kW can be used, but generally is within the range of from about 2.5 kW to about 10 kW, or from about 3 kW to about 6 kW. The beam current generally is greater than about 100 milliamps, and can be in the range of from about 100 milliamps to about 600 milliamps. The beam power is variable, and is generated by using an input voltage in the range of from about 100 V to about 500 V. An exemplary input voltage is about 110 V. may be derived by using about 100 V to about 600 V (e.g., 110 V) input voltage.

By moving the electron beam relative to the surface of the workpiece along a predetermined path, the area heated by the electron beam layer can be defined in two dimensions on the substrate, the width of the layer being determined by the diameter of the electron beam where it strikes the substrate. The movement of the electron beam along a predetermined path can be under computer control. Modulating the beam shape and/or duration provides a way to control the specific power provided by the electron beam device during the movement of the electron beam across the surface of the workpiece. The electron beam also can be delivered in pulses. As discussed in further detail below, the electron beam device may be moved using mechanical and/or hydraulic actuators to define a preheated area or molten pool in the base material. Also, the preheated area or molten pool may also be defined by modulating the electron beam using electromagnetic coils.

The thermal energy of the laser beam of the laser device melts the end of the metal wire, forming droplets of molten metal of the metal wire that drop onto the preheated area of the base material beneath the end of the metal wire. The laser beam of the laser device also can contribute thermal energy in the vicinity of the preheated area of the target deposition area, contributing to the thermal energy provided by the electron beam of the electron beam device. The superheat from the droplets of molten metal can help maintain a melt pool in the vicinity of the preheated area of the base material. The system can include a metal wire feeding device to provide the metal wire to the desired location beneath the laser beam of the laser device. The metal wire feeding device can be positioned between the laser device and the electron beam device, or can be positioned so that it is in closer proximity to the laser device than the electron beam device.

The system also can include a positioning device that can position the metal wire above the preheated area in the base material formed by the electron beam device. The positioning device also can properly place the end of the metal wire into the laser beam of the laser device so that the metal wire melts properly and that the droplets of molten metal formed by the melting wire drop onto the preheated area of the base material beneath it.

The metal wire can be or contain Al, Cr, Cu, Fe, Hf, Sn, Mn, Mo, Ni, Nb, Si, Ta, Ti, V, W, or Zr, or composites or alloys thereof. In some embodiments, the metal wire contains Ti or a Ti alloy. The metal wire can be or contain a titanium alloy containing Ti in combination with one or a combination of Al, V, Sn, Zr, Mo, Nb, Cr, W, Si, and Mn. For example, exemplary titanium alloys include Ti-6Al-4V, Ti-6Al-6V-2Sn, Ti-6Al-2Sn-4Zr-6Mo, Ti-45Al-2Nb-2Cr, Ti-47Al-2Nb-2Cr, Ti-47Al-2 W-0.5Si, Ti-47Al-2Nb-1Mn-0.5 W-0.5Mo-0.2Si, and Ti-48Al-2Nb-0.7Cr-0.3Si. The metal wire can contain aluminum, iron, cobalt, copper, nickel, carbon, titanium, tantalum, tungsten, niobium, gold, silver, palladium, platinum, zirconium, alloys thereof, and combinations thereof. In some applications, the metal wire is free of Al. The metal wire can have any cross sectional shape. The wire can have a circular cross section. The diameter of the wire can be up to about 10 mm. The diameter of the wire can be in the range of from about 0.8 mm to about 5 mm. The metal wire can have any practically implementable cross-sectional dimension, e.g., 1.0 mm, 1.6 mm, 2.4 mm, etc. The feed rate and positioning of the metal wire can be computer controlled, in order to ensure that the metal wire is melted when it reaches the intended position above the preheated area or molten pool in the base material.

The laser device can generate a laser beam of sufficient energy to transfer thermal energy to the metal wire to melt the wire to form molten drops of metal. Examples of suitable laser devices include a ytterbium (Yb) laser, a Yb fiber laser, a Yb fiber coupled diode laser, a Yb:glass laser, a diode-pumped Yb:YAG laser, a neodymium-doped yttrium aluminum garnet (Nd:YAG) laser, a $CO_2$ laser, a CO laser, a Nd:glass laser, a neodymium-doped yttrium orthovanadate (Nd:YVO) laser, a Cr:ruby laser, a diode laser, a diode pumped laser, an excimer laser, a gas laser, a semiconductor laser, a solid-state laser, a dye laser, an X-ray laser, a free-electron laser, an ion laser, a gas mixture laser, a chemical laser, and combinations thereof. Preferred lasers include Yb lasers, particularly Yb fiber lasers. In many applications, the wavelength used in a Yb fiber laser can be less reflective compared to other laser wavelengths.

An exemplary configuration is shown in FIG. 9. In the configuration shown, a base material 200 shaped as a rectangular cuboid is being produced by solid freeform fabrication. The figure illustrates the initial part of the deposition process where the first welding stripe 220 is being deposited. The two gun system illustrated in FIG. 9 includes an electron beam device 610 positioned such that the electron beam 620 that it produces is directed to a target area to pre-heat a portion of the surface of the base material 200 at the target area, and a laser device 410 that produces a laser beam 420 that can heat and melt a metal wire 155.

The laser beam 420 of laser device 410 can be directed to the distal end of metal wire 155 to melt the metal wire and form molten metal droplets 165. The amount of thermal energy provided by the laser beam 420 of the laser device 410 can be regulated to maintain a heating and melting rate in accordance with the feeding velocity of the metal wire 155 such that the formation of the molten metal droplets 165 are timed to maintain a continuous drip of melted metal wire 155 onto the preheated area or molten pool 210. The laser beam 420 and the feeding velocity of the metal wire 155 exiting the metal wire feeder 145 can be constantly regulated and controlled by a control system, e.g., computer, such that the preheated area or molten pool 210 is supplied with melted metal wire 155 at a rate providing the intended deposition rate of the metal or metal alloy onto base material 200. The metal wire can be fed at any angle into the laser beam, and is not constrained to the angle depicted in FIG. 9. The control system can be simultaneously engaged to operate and regulate the engagement of an actuator (not shown) that constantly positions and moves the base material 200 such that the preheated area or molten pool 210 is located at the intended deposition spot as given by the CAD model of the object that is to be formed.

The electron beam device 610 can be mounted so as to be moveable under the control of a computer in the X-Y plane parallel to the base material surface, and vertically in the Z direction orthogonal to it. The electron beam 620 of the electron beam device 610 thus can be directed to any point in the X-Y plane on the surface of the workpiece, and vertically so as to accommodate workpieces of different height, and regions of different height within workpieces. As illustrated in FIG. 9, the traverse direction is in the direction of arrow 240, the apparatus being in the process of fabricating the layer 220.

In an alternative configuration, a laser device is used as a first welding gun and can be arranged to direct a laser beam to a target area of the base material to form a preheated area, and an electron beam device is used as a second welding gun and can be positioned to direct an electron beam onto an end of a metal wire positioned above the preheated area of the base material. The thermal energy of the electron beam melts the end of the metal wire, forming droplets of molten metal of the metal wire that drop onto the preheated area of the base material beneath the end of the metal wire. The laser beam of the laser device pre-heats a target area and can promote fusion between the base material and the molten metal material by deepening the melt-in of the droplets of molten metal into the base material. In this embodiments, as discussed with respect to other embodiments, the electron beam of the electron beam device can also be used to contribute thermal energy in the preheated area or molten pool in the base material at the target deposition area, contributing to the thermal energy provided by the laser beam. The superheat from the droplets of molten metal can help maintain a melt pool in the vicinity of the preheated area of the base material. The system can include a metal wire feeding device to provide the metal wire to the desired location beneath the electron beam. The metal wire feeding device can be positioned between the electron beam device and the laser device, or can be positioned so that it is in closer proximity to the electron beam device than the laser device.

An exemplary embodiment is shown in FIG. 10. In the embodiment shown, a base material 200 shaped as a rectangular cuboid is being produced by solid freeform fabrication. The figure illustrates the initial part of the deposition process where the first welding stripe 220 is being deposited. The two gun system illustrated in FIG. 10 includes a laser device 410 that produces a laser beam 420 directed to a target area to pre-heat a portion of the surface of the base material 200 at the target area, and an electron beam device 710 positioned such that the electron beam 720 that it produces can heat and melt a metal wire 155.

The electron beam 720 of electron beam device 710 can be directed to the distal end of metal wire 155 to melt the metal wire and form molten metal droplets 165. The amount of thermal energy provided by the electron beam 720 of the electron beam device 710 can be regulated to maintain a heating and melting rate in accordance with the feeding velocity of the metal wire 155 such that the formation of the molten metal droplets 165 are timed to maintain a continuous drip of melted metal wire 155 onto the preheated area or molten pool 210. The electron beam 720 and the feeding velocity of the metal wire 155 exiting the metal wire feeder 145 can be constantly regulated and controlled by a control system, e.g., computer, such that the preheated area or molten pool 210 is supplied with melted metal wire 155 at a rate providing the intended deposition rate of the metal or metal alloy onto base material 200. The metal wire can be fed at any angle into the electron beam, and is not constrained to the angle depicted in FIG. 10. The control system can be simultaneously engaged to operate and regulate the engagement of an actuator (not shown) that constantly positions and moves the base material 200 such that the preheated area or molten pool 210 is located at the intended deposition spot as given by the CAD model of the object that is to be formed.

The laser device 410 can be mounted so as to be moveable under the control of a computer in the X-Y plane parallel to the base material surface, and vertically in the Z direction orthogonal to it. The laser beam 420 of the laser device 410 thus can be directed to any point in the X-Y plane on the surface of the workpiece, and vertically so as to accommodate workpieces of different height, and regions of different height within workpieces. As illustrated in FIG. 10, the traverse direction is in the direction of arrow 240, the apparatus being in the process of fabricating the layer 220.

In the two welding gun systems provided herein that include a laser device and an electron beam device, the metal wire can be or contain Al, Cr, Cu, Fe, Hf, Sn, Mn, Mo, Ni, Nb, Si, Ta, Ti, V, W, or Zr, or composites or alloys thereof. In some embodiments, the metal wire contains Ti or a Ti alloy. The metal wire can be or contain a titanium alloy containing Ti in combination with one or a combination of Al, V, Sn, Zr, Mo, Nb, Cr, W, Si, and Mn. For example, exemplary titanium alloys include Ti-6Al-4V, Ti-6Al-6V-2Sn, Ti-6Al-2Sn-4Zr-6Mo, Ti-45Al-2Nb-2Cr, Ti-47Al-2Nb-2Cr, Ti-47Al-2 W-0.5Si, Ti-47Al-2Nb-1Mn-0.5 W-0.5Mo-0.2Si, and Ti-48Al-2Nb-0.7Cr-0.3Si. The metal wire can contain aluminum, iron, cobalt, copper, nickel, carbon, titanium, tantalum, tungsten, niobium, gold, silver, palladium, platinum, zirconium, alloys thereof, and combinations thereof. The metal can be free of Al. The metal wire can have a circular cross section. The diameter of the wire can be in the range of from about 0.8 mm to about 5 mm. The metal wire can have any practically implementable cross-sectional dimension, e.g., 1.0 mm, 1.6 mm, 2.4 mm, etc.

In the two welding gun systems provided herein that include an electron beam device, the system includes a housing that defines a sealable chamber that can be evacuated within which some or all of the components may reside. At least a portion of one or more of the components (e.g., the control system, the power supply, or a computer) may reside outside of the chamber. The sealable chamber can be configured to enclose the metal wire feeder, the electron beam device, the laser device, the workpiece, and the actuator tray that moves the base material relative to at least the first heating device, or an actuator arm that moves the first heating device, or an actuator arm that moves the second heating device or any combination thereof. The chamber can be evacuated as desired for processing. The chamber can be evacuated, e.g., using a suitable vacuum pump or pump system so that the pressure within the chamber ranges from about $1 \times 10^{-1}$ to about $1 \times 10^{-7}$ torr or lower. During the deposition process, it can be desirable to reduce the pressure within the chamber to a pressure less than about 0.1 torr, or less than about $1 \times 10^{-2}$ torr, or less than about $1 \times 10^{-6}$ torr.

System Containing Two Electron Beam Devices

In some configurations of the two welding gun system provided herein, the system includes an electron beam device as a first welding gun for pre-heating the target deposition area on the base material, and another electron beam device as a second welding gun for heating and melting a metal wire onto the preheated area or molten pool. The first electron beam device can be arranged to direct energy to a target area of the base material to form a molten pool. The first electron beam preheats the base material so that it is receptive to molten drops of melted metal wire at the position at which the melted metallic material is to be deposited. In some embodiments, at least a portion of the base material is melted by the first electron beam device to make the base material more receptive. In some embodiments, sufficient heat is applied by the first electron beam device to form a preheated area or molten pool in the base material at the position at which the metallic material is to be deposited. The first electron beam device can promote fusion between the base material and the melted metallic material by deepening the melt-in in the base material. The first electron beam device can help to ensure adequate melt-in by the superheated melted metallic material that the melted metallic material may not be able to achieve by itself. The preheated area or molten pool can be monitored, e.g., for temperature and size, and based on the information obtained, the power of the electron beam device can be modulated in order to maintain the preheated area or molten pool within the desired parameters, such as within a predetermined size.

The first electron beam device can be configured so that the electron beam it produces can be scanned along the X or Y direction over the surface of the workpiece to cover a wider area than just a focused point of the electron beam. The scan spacing can be from about 0.001 to about 0.1 inch. The melting characteristics of the target area heated by the electron beam of the first electron beam device can be modified by adjusting the electron beam device. The electron beam device can be selected so that it contains electromagnetic coils to modulate the electron beam. The electron beam device can provide energy in the form of a stream of focused electrons accelerated towards the workpiece. The electrons can be accelerated using a high voltage potential (e.g., greater than about 15 kV, such as in the range of from about 15 kV to about 150 kV). The electrons can be generated within the electron beam device using one or more heated filaments. The power output of the electron beam device typically can be controlled by limiting or modulating the flow of electrons to the workpiece. For example, an electron beam power of up to about 30 kW can be used, but generally is within the range of from about 2.5 kW to about 10 kW, or from about 3 kW to about 6 kW. The beam current generally is greater than about 100 milliamps, and can be in the range of from about 100 milliamps to about 600 milliamps. The beam power is variable, and can be generated by using an input voltage in the range of from about 100 V to about 500 V. An exemplary input voltage is about 110 V.

The electron beam device may also be moved using mechanical and/or hydraulic actuators to define the preheated area or molten pool in the base material.

By moving the electron beam of the first electron beam device relative to the surface of the workpiece along a predetermined path, the area heated by the electron beam of the first electron beam device can be defined in two dimensions on the substrate, the width being determined by the diameter of the electron beam where it strikes the substrate. The movement of the electron beam along a predetermined path can be under computer control. Modulating the pulse shape and/or duration provides a way to control the specific power provided by the electron beam device during the movement of the electron beam across the surface of the workpiece. The electron beam also can be delivered in pulses.

The second electron beam device can be arranged to direct an electron beam on an end of a metal wire positioned above the molten pool, so that the thermal energy produced by the electron beam of the second electron beam device melts the end of the metal wire, forming droplets of molten metal that drop onto the preheated area or molten pool beneath the end of the metal wire. As discussed in conjunction with other embodiments, the electron beam of the second electron beam device can also be used to contribute thermal energy in the preheated area or molten pool in the base material at the target deposition area, contributing to the thermal energy provided by the first electron beam device. The system can include a metal wire feeding device to provide the metal wire to the second electron beam device.

The second electron beam device can have a variable power output that can be adjusted to provide a substantially constant power or energy to the metal wire in an amount that provides substantially constant melting rate of the metal wire. The power or energy delivered by the second electron beam device can be modulated depending on the constitution of the metal wire so that the metal wire can be fed at a constant rate and is melted onto the preheated area or molten pool on the base material. The first and second electron beam devices each independently can include a single electron beam gun, or each can include a plurality of electron beam guns. The two gun system can include one or more detectors, e.g., to detect electrons produced by the electron beam gun, or to monitor the molten pool, such as temperature sensors or cameras or both a detector including a camera, an electron phenomena detecting mechanism, or a combination thereof.

Electron beam devices are commercially available and described in the art (e.g., see U.S. Pat. No. 3,136,882 (Radtke, 1964); U.S. Pat. No. 3,187,216 (Sciaky, 1965); U.S. Pat. No. 3,535,489 (Hinrichs (1970); U.S. Pat. No. 3,592,995 (Hinrichs, 1971); U.S. Pat. No. 3,766,355 (Kottkamp, 1973); U.S. Pat. No. 4,058,697 (Sokolov et al., 1977); U.S. Pat. No. 4,327,273 (Kita et al., 1982); U.S. Pat. No. 4,677,273 (Colegrove et al., 1987); U.S. Pat. No. 4,698,546, Maitland et al., 1987); U.S. Pat. No. 6,882,095 (Avnery, 2005); and Taminger and Hafley, *Electron Beam Freeform Fabrication for Cost Effective Near Net Shape Manufacturing*," NATO, 2006). The electron beam device can be selected so that it contains electromagnetic coils to modulate the electron beam. The electron beam gun can provide energy in the form of a stream of focused electrons accelerated towards the workpiece or metal wire. The electrons can be accelerated using a high voltage potential (e.g., greater than about 15 kV, such as in the range of from about 15 kV to about 150 kV). The electrons can be generated within the electron beam device using one or more heated filaments. The power output of the electron beam device typically can be controlled by limiting or modulating the flow of electrons to the workpiece or metal wire. For example, a beam power of up to about 30 kW can be used, but generally is within the range of from about 2.5 kW to about 10 kW, or from about 3 kW to about 6 kW. The beam current generally is greater than about 100 milliamps, and can be in the range of from about 100 milliamps to about 600 milliamps. The beam power is variable, and is generated by using an input voltage in the range of from about 100 V to about 500 V. An exemplary input voltage is about 110 V.

The system also can include a positioning device that can position the metal wire above the preheated area or molten pool formed by the laser in the base material. The positioning device also can properly place the end of the metal wire into the plasma transferred arc so that it melts properly and that the droplets formed drop onto the preheated area or molten pool beneath it.

The metal wire can be or contain titanium. The metal wire can be or contain a titanium alloy containing Ti in combination with one or a combination of Al, V, Sn, Zr, Mo, Nb, Cr, W, Si, and Mn. For example, exemplary titanium alloys include Ti-6Al-4V, Ti-6Al-6V-2Sn, Ti-6Al-2Sn-4Zr-6Mo, Ti-45Al-2Nb-2Cr, Ti-47Al-2Nb-2Cr, Ti-47Al-2 W-0.5Si, Ti-47Al-2Nb-1Mn-0.5 W-0.5Mo-0.25i, and Ti-48Al-2Nb-0.7Cr-0.35i. The metal wire can contain aluminum, iron, cobalt, copper, nickel, carbon, titanium, tantalum, tungsten, niobium, gold, silver, palladium, platinum, zirconium, alloys thereof, and combinations thereof. The metal wire can be free of Al. The metal wire can have any desired cross sectional shape. The metal wire can have a circular cross section. The diameter of the metal wire can be in the range of from about 0.8 mm to about 5 mm. The metal wire can have any practically implementable cross-sectional dimension, e.g., 1.0 mm, 1.6 mm, 2.4 mm, etc. The feed rate and positioning of the metal wire can be controlled and modulated in accord with the effect of thermal energy provided by the electron beam device in order to ensure that the metal wire is being continuously heated and is melted when it reaches the intended position above the preheated area or molten pool in the base material.

The system can include a housing that defines a sealable chamber that can be evacuated within which some or all of the components may reside. At least a portion of one or more of the components (e.g., the control system, the power supply, or a computer) may reside outside of the chamber. The sealable chamber can be configured to enclose the metal wire feeder, the first electron beam device, the second electron beam device, the workpiece, and the actuator tray that moves the base material relative to at least the first heating device, or an actuator arm that moves the first heating device, or an actuator arm that moves the second heating device or any combination thereof. The chamber can be evacuated as desired for processing. The chamber can be evacuated, e.g., using a suitable vacuum pump or pump system within the chamber ranges from about $1\times10^{-1}$ to about $1\times10^{-7}$ torr or lower. During the deposition process, it can be desirable to reduce the pressure within the chamber to a pressure less than about 0.1 torr, or less than about $1\times10^{-2}$ torr, or less than about $1\times10^{-6}$ torr.

An exemplary embodiment is shown in FIG. 11. In the embodiment shown, a base material 200 shaped as a rectangular cuboid is being produced by solid freeform fabrication. The figure illustrates the initial part of the deposition process where the first welding stripe 220 is being deposited. The two gun system illustrated in FIG. 11 includes a first electron beam device 610 positioned such that the electron beam 620 that it produces is directed to a target area and heats at least a portion of the surface of the target area. In some applications, the electron beam 620 can heat and optionally at least partially melt a portion of the surface of the target area, and can contribute to the production of preheated area or molten pool 210 on the base material 200 at the target area. A second electron beam device 710 produces an electron beam 720 that is directed onto an end of a metal wire positioned above the preheated area of the base material. The thermal energy of the electron beam 720 melts the end of the metal wire, forming droplets of molten metal of the metal wire that drop onto the preheated area of the base material beneath the end of the metal wire. The electron beam 620 of the first electron beam device 610 can promote fusion between the base material and the molten metal material by deepening the melt-in of the droplets of molten metal into the base material. The electron beam 720 of the second electron beam device 710 also can contribute thermal energy in the vicinity of the preheated area of the target deposition area, contributing to the thermal energy provided by the electron beam 620 of the first electron beam device 610. The superheat from the droplets of molten metal can help maintain a melt pool in the vicinity of the preheated area of the base material.

The metal wire 155 can be supplied by metal wire feeder 145 and can be positioned such that the end of the metal wire 155 is located above the preheated area or molten pool 210 at the deposition area on the base material 200. The metal wire 155 can be given a velocity toward the electron beam 720. The velocity of the metal wire 155 can be selected so that the heating and melting rate of the distal end of the metal wire 155 is such that molten metal droplets 165 of melted metal wire 155 are continuously being supplied to the preheated area or molten pool 210.

The metal wire 155 is of or contains a combination of metals that when melted forms the material from which the workpiece is to be formed by freeform fabrication. The metal wire 155 can be titanium, or can be or contain a titanium alloy containing Ti in combination with one or a combination of Al, V, Sn, Zr, Mo, Nb, Cr, W, Si, and Mn. For example, exemplary titanium alloys include Ti-6Al-4V, Ti-6Al-6V-2Sn, Ti-6Al-2Sn-4Zr-6Mo, Ti-45Al-2Nb-2Cr, Ti-47Al-2Nb-2Cr, Ti-47Al-2 W-0.5Si, Ti-47Al-2Nb-1Mn-0.5 W-0.5Mo-0.2Si, and Ti-48Al-2Nb-0.7Cr-0.3Si. The metal wire can contain aluminum, iron, cobalt, copper, nickel, carbon, titanium, tantalum, tungsten, niobium, gold, silver, palladium, platinum, zirconium, alloys thereof, and combinations thereof. In some applications, the metal wire does not include Al.

The metal wire 150 can be continuously delivered to the electron beam 720 created by the second electron beam system 710 where it is heated to its melting point or fully melted into droplets of molten metal 165 that are deposited into the preheated area or molten pool 210 on the base material 200. The metal wire can be fed at any angle into the electron beam, and is not constrained to the angle depicted in FIG. 11.

The two gun system can include a control system that can operate and regulate the engagement of an actuator (not shown) which constantly positions and moves the base material 200 such that the preheated area or molten pool is located at the intended deposition spot as given by the CAD-model of the object that is to be formed. At this stage of the SFFF-process, the base material 200 is moved as indicated by arrow 240. The actuator is moveable under the control of the control system in the X-Y plane parallel to two gun system, and vertically in the Z direction orthogonal to it. The focal point of each of electron beam device 710 and electron beam device 610 also is movable. For example, changing the focal point of the electron beam device 610 can allow electron beam 620 to be directed to any point in the X-Y plane and to be adjusted vertically so as to accommodate both workpieces of different height and also regions of different height within workpieces. Changing the focal point of the electron beam device 710 can allow electron beam 720 to be focused on a metal wire that can be repositioned closer to or further way from the workpiece surface. During cooling, the electron beam device 610 can be directed onto the cooling molten layer to modulate the microstructure of the delivered layer of molten metal.

The first and second electron beam devices can advantageously have separate power sources and devices for regulating the power supply to the respective devices. The systems can include sensors for monitoring the temperature of the deposition area of the base material and the width and positioning of the electron beam can be varied on the surface of the preheated area or molten pool and/or the metal wire. In the two gun systems provided herein, the use of a first gun containing a heating device to preheat the base material and form a preheated area, and a second gun containing a heating device to melt a metal wire or metal particles, provides the advantage that it becomes possible to increase the heat supply to the metal wire or metal particles independently of the heat supplied to the substrate. The melting power applied to the metal wire or metal particles can be selected to match the mass input (the amount of molten metal droplets to be added to the workpiece) in order to secure a stable melting of the metal wire and/or burn-off point or to ensure complete melting of the metal particles. Thus, it is possible to increase the deposition rate of the molten metallic feed material without simultaneously over-heating the substrate and without risk of forming an excessive preheated area or molten pool and thus, losing control of the consolidation of the deposited material.

It will be apparent to those skilled in the art that various modifications and variation can be made in the present invention without departing from the scope of the invention. Thus, it is intended that the present invention cover the modifications and variations of this invention provided they come within the scope of the appended claims and their equivalents.

REFERENCE SIGNS LIST

The following is a listing of the reference numerals used in the description and the accompanying Drawings.
110 PTA torch
120 Torch electrode
130 Plasma transferred arc
140 Metal wire feeder 145 Metal wire feeder
150 Metal wire
155 Metal wire
160 Molten metal droplets
165 Molten metal droplets
170 Velocity arrow
200 Base material
210 Preheated Area or Molten pool
220 Welding stripe
240 Direction arrow
310 Power source
320 Power source
330 Pulsing frequency generator
410 Laser device
420 Laser beam
430 Second laser device
440 Laser beam
510 Blown powder laser device
520 Molten particles
530 Support
610 First electron beam device
620 Electron beam
710 Second electron beam device
720 Electron beam

What is claimed is:

1. A system for building metallic objects by solid freeform fabrication, comprising:
    a first welding gun directed exclusively toward a portion of a surface of a base material for pre-heating said portion of the surface of the base material onto which metallic material melted from a source of metal is to be deposited;
    a second welding gun directed toward the source of metal for melting the source of metal into droplets of the metallic material that are deposited onto the preheated surface of the base material; and
    a deposition profile of an object to be formed such that the object is built by fusing successive deposits of the metallic material onto the base material.

2. The system of claim 1, further comprising an actuator tray that moves the base material relative to at least the first welding gun.

3. The system of claim 1, further comprising:
    an actuator tray that moves the base material relative to at least the first welding gun; and
    a computer-aided manufacturing (CAM) system or software that directs a movement of the actuator tray, in response to the deposition profile.

4. The system of claim 1, wherein the first welding gun comprises a laser device and the second welding gun comprises a PAW torch.

5. The system of claim 4, further comprising an actuator arm that moves the first welding gun.

6. The system of claim 4, further comprising an actuator arm that moves the second welding gun.

7. The system of claim 4, wherein the PAW torch is a PTA torch comprising an electrode and electrically connected to a direct current power source such that the electrode of the PTA torch becomes a cathode and the source of metal is a metal wire that becomes an anode.

8. The system of claim 1, wherein the first welding gun comprises a PAW torch and the second welding gun comprises a laser device.

9. The system of claim 1, wherein the first welding gun comprises a first laser device and the second welding gun comprises a second laser device.

10. The system of claim 1, wherein the first welding gun comprises a laser device and the second welding gun comprises a coaxial powder feed nozzle laser system.

11. The system of claim 1, wherein the first welding gun comprises a first electron beam device and the second welding gun comprises a laser device.

12. The system of claim 1, wherein the first welding gun comprises a laser device and the second welding gun comprises an electron beam device.

13. The system of claim 1, wherein the first welding gun comprises a first electron beam device and the second welding gun comprises second electron beam device.

14. The system of claim 1, wherein the second welding gun is designed to contribute thermal energy in the preheated area.

15. A method for manufacturing a three-dimensional object of a metallic material by solid freeform fabrication, where the object is made by fusing together successive deposits of the metallic material onto a base material, the method comprising:
    defining a deposition profile of the object;
    using a first welding gun directed exclusively toward a portion of a surface of the base material to preheat at least the portion of the surface of the base material to form a preheated surface; and
    using a second welding gun to heat and melt a metallic material such that molten metallic material is deposited onto the preheated surface to form the object by fusing successive deposits of the melted metallic material.

16. The method of claim 15, further comprising:
    a) moving an actuator tray to move the base material relative to the first welding gun or the second welding gun or both; or
    b) moving a first actuator arm to move the first welding gun relative to the base material of the second welding gun or both; or
    c) moving a second actuator arm to move the second welding gun relative to the base material or the first welding gun or both; or
    d) any combination of a), b) and c).

17. The method claim 15, where the movement of any of the actuator tray or first actuator arm or second actuator arm is controlled by a CAM system or software and in response to the deposition profile such that the successive deposits of molten metallic material when solidified forms the three-dimensional object.

18. The method of claim 15, wherein the first welding gun comprises a PAW torch and the second welding gun comprises a laser device.

19. The method of claim 18, wherein the PAW torch is a PTA torch electrically connected to a direct current power source such that the electrode of the PAW torch becomes the cathode and the metallic material is a metal wire becomes the anode.

20. The method of claim 15, wherein:
    the first welding gun comprises a laser device and the second welding gun comprises a PAW torch; or
    the first welding gun comprises a first laser device and the second welding gun comprises a second laser device; or
    the first welding gun comprises a laser device and the second welding gun comprises a coaxial powder feed nozzle laser system; or
    the first welding gun comprises a first electron beam device and the second welding gun comprises a laser device; or the first welding gun comprises a laser device and the second welding gun comprises an electron beam device; or the first welding gun comprises a first electron beam device and the second welding gun comprises second electron beam device.

\* \* \* \* \*